US009465908B2

(12) United States Patent
Bischoff et al.

(10) Patent No.: US 9,465,908 B2
(45) Date of Patent: Oct. 11, 2016

(54) METHOD FOR DESIGNING A PHYSICAL LAYOUT OF A PHOTOVOLTAIC SYSTEM

(71) Applicant: Siemens Aktiengesellschaft, Munich (DE)

(72) Inventors: Martin Bischoff, Holzkirchen (DE); Oliver Hennig, Munich (DE); Karl-Heinz Kufer, Weilerbach (DE); Kai Plociennik, Kaiserslautern (DE); Ingmar Schule, Kaiserslautern (DE); Jens Weber, Neunkirchen am Brand (DE)

(73) Assignee: Siemens Aktiengesellschaft, Munich (DE)

( * ) Notice: Subject to any disclaimer, the term of this patent is extended or adjusted under 35 U.S.C. 154(b) by 77 days.

(21) Appl. No.: 14/360,638

(22) PCT Filed: Nov. 6, 2012

(86) PCT No.: PCT/EP2012/071908
§ 371 (c)(1),
(2) Date: May 26, 2014

(87) PCT Pub. No.: WO2013/079282
PCT Pub. Date: Jun. 6, 2013

(65) Prior Publication Data
US 2014/0331198 A1 Nov. 6, 2014

(30) Foreign Application Priority Data
Nov. 29, 2011 (DE) .......... 10 2011 055 849
Jul. 6, 2012 (DE) .......... 10 2012 106 124

(51) Int. Cl.
*G06F 17/50* (2006.01)
*H02S 50/00* (2014.01)
(Continued)

(52) U.S. Cl.
CPC .......... *G06F 17/5081* (2013.01); *G06F 17/50* (2013.01); *G06F 17/5009* (2013.01);
(Continued)

(58) Field of Classification Search
CPC .............. G06F 17/50; G06F 17/5004; G06F 17/5009; H02S 50/00
USPC ........................ 703/1, 18; 716/118–120, 139
See application file for complete search history.

(56) References Cited

U.S. PATENT DOCUMENTS

| 6,546,535 B1* | 4/2003 | Nagao | G06F 11/2035 |
| | | | 136/243 |
| 8,448,096 B1* | 5/2013 | Wang | G06F 17/5068 |
| | | | 716/52 |

(Continued)

FOREIGN PATENT DOCUMENTS

| EP | 1939775 A2 | 7/2008 |
| KR | 20090042953 A | 5/2009 |

OTHER PUBLICATIONS

Blair N. et al; "Modeling Photovoltaic and Concentrating Solar Power Trough Performance, Cost, and Financing with Solar Advisor Model"; American Solar Energy Society—Solar 2008, Including Proc. of 37th Ases Annual Conf., 33rd National Passive Solar Conf., 3rd Renewable Energy Policy and Marketing Conf., Catch the Clean Energy Wave—American Solar Energy Society—Solar 2008, Inclu; vol. 2; pp. 1051-1076; p. 153, col. 1, par. 2, chapter 3, the whole document; XP009170118; 2008.

*Primary Examiner* — Stacy Whitmore
(74) *Attorney, Agent, or Firm* — Beusse Wolter Sanks & Maire

(57) ABSTRACT

A method for creating a physical layout of a photovoltaic system in a specified field is provided where the photovoltaic system is specified by a plurality of technical properties. The method includes reading out more than 20 pre-calculated, completed layouts for the photovoltaic system from a memory; presenting the completed layouts in a graphical presentation wherein each of the completed layouts is represented by at least one partial amount of the plurality of technical properties; modifying value ranges of the presented technical properties, in order to present a modified number of completed layouts in a comparable manner; and selecting an optimized layout that has been optimized with regard to the presented properties from the modified number of completed layouts. Thereby a photovoltaic system having a high nominal power can be established in the best possible manner. The physical layout of the entire photovoltaic system is adapted to the specified field.

15 Claims, 16 Drawing Sheets

(51) Int. Cl.
*H02S 10/00* (2014.01)
*H01L 31/02* (2006.01)
*H01L 31/04* (2014.01)
*H02S 20/10* (2014.01)
*G01R 31/40* (2014.01)

(52) U.S. Cl.
CPC ......... *H01L31/02021* (2013.01); *H02S 10/00* (2013.01); *H02S 20/10* (2014.12); *G06F 17/5004* (2013.01); *H02S 50/00* (2013.01); *Y02E 10/50* (2013.01)

(56) References Cited

U.S. PATENT DOCUMENTS

| | | | | |
|---|---|---|---|---|
| 8,826,163 | B1* | 9/2014 | Chanin | G06F 3/04842 703/1 |
| 8,878,112 | B2* | 11/2014 | Lee | F24J 2/38 126/576 |
| 9,053,275 | B2* | 6/2015 | Brier | G06F 17/5063 |
| 9,112,078 | B2* | 8/2015 | Klein | H01L 31/042 |
| 2008/0162380 | A1 | 7/2008 | Ishikawa | |
| 2009/0151775 | A1* | 6/2009 | Pietrzak | H02S 20/00 136/251 |
| 2010/0217565 | A1* | 8/2010 | Wayne | G06F 17/5004 703/1 |
| 2011/0137591 | A1* | 6/2011 | Ishibashi | G06Q 10/04 702/60 |
| 2011/0148210 | A1* | 6/2011 | Cherukupalli | H01L 31/02021 307/77 |
| 2011/0307199 | A1* | 12/2011 | Klein | H01L 31/042 702/60 |
| 2012/0004780 | A1* | 1/2012 | Miller | F24J 2/38 700/286 |
| 2012/0035887 | A1* | 2/2012 | Augenbraun | G06T 17/00 703/1 |
| 2012/0080955 | A1* | 4/2012 | Fishman | H01L 31/02021 307/82 |
| 2012/0242321 | A1* | 9/2012 | Kasai | G01J 5/0066 324/72 |
| 2012/0310427 | A1* | 12/2012 | Williams | G05F 1/67 700/287 |
| 2013/0061189 | A1* | 3/2013 | Brier | G06F 3/0481 716/102 |
| 2013/0061198 | A1* | 3/2013 | Brier | G06F 3/0481 716/139 |
| 2013/0211616 | A1* | 8/2013 | Moore | H02J 7/0013 700/295 |
| 2013/0246010 | A1* | 9/2013 | Dershowitz | H01L 31/042 703/1 |
| 2014/0025344 | A1* | 1/2014 | Brier | G06F 17/5063 703/1 |
| 2014/0032178 | A1* | 1/2014 | Kicinski | G06F 17/5004 703/1 |
| 2014/0130840 | A1* | 5/2014 | Hinners | H01L 31/042 136/244 |
| 2014/0195206 | A1* | 7/2014 | Eich | G06F 17/50 703/1 |
| 2014/0207431 | A1* | 7/2014 | Reinhart | G06F 17/5009 703/2 |
| 2014/0207437 | A1* | 7/2014 | Hoff | H02S 50/10 703/18 |
| 2014/0246072 | A1* | 9/2014 | Wayne | H01L 31/042 136/244 |
| 2014/0265603 | A1* | 9/2014 | Augustoni | H02S 50/00 307/80 |
| 2014/0290155 | A1* | 10/2014 | Conger | F24J 2/5241 52/146 |
| 2014/0331198 | A1* | 11/2014 | Bischoff | G06F 17/50 716/135 |
| 2014/0366466 | A1* | 12/2014 | DeBartolo, III | E04H 6/025 52/173.3 |
| 2015/0081255 | A1* | 3/2015 | Chanin | G06F 3/04842 703/1 |
| 2015/0097117 | A1* | 4/2015 | Kasai | G01J 5/0066 250/338.1 |
| 2015/0100281 | A1* | 4/2015 | Fink | G06F 17/5009 703/1 |
| 2015/0178440 | A1* | 6/2015 | Fink | G06F 17/50 716/122 |
| 2015/0248509 | A1* | 9/2015 | Sagues | G06F 17/5009 703/13 |

* cited by examiner

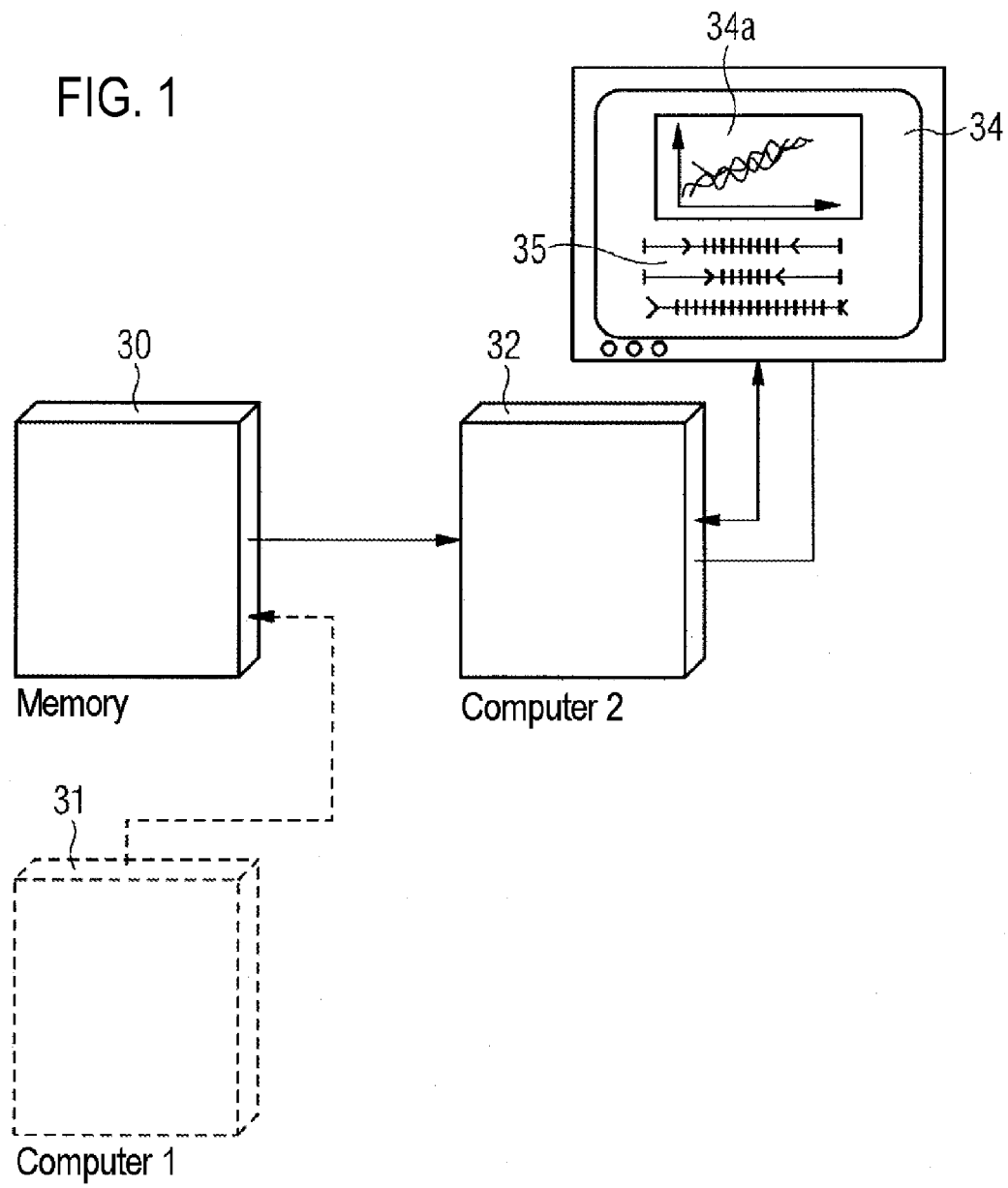

Sixth column group of panels $T_n$

FIG. 7
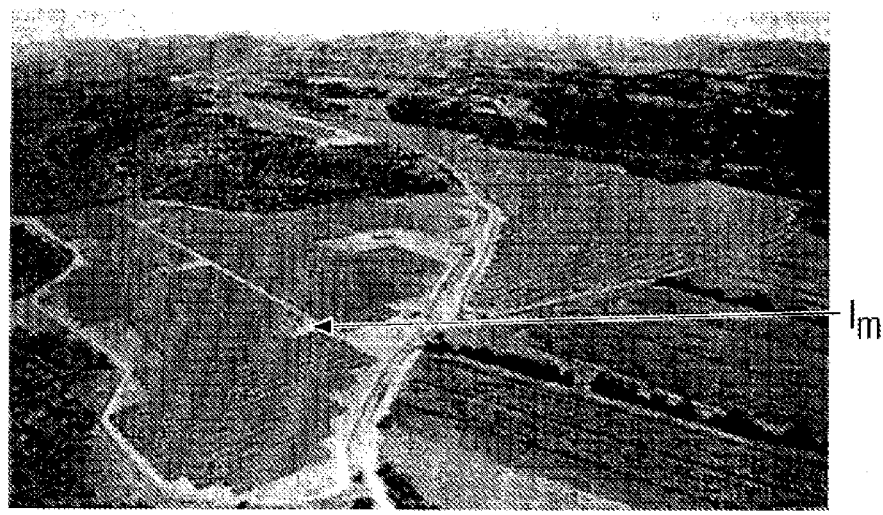
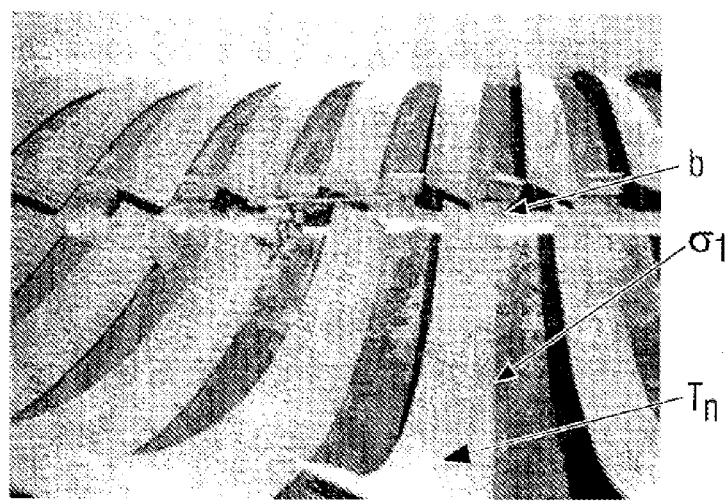
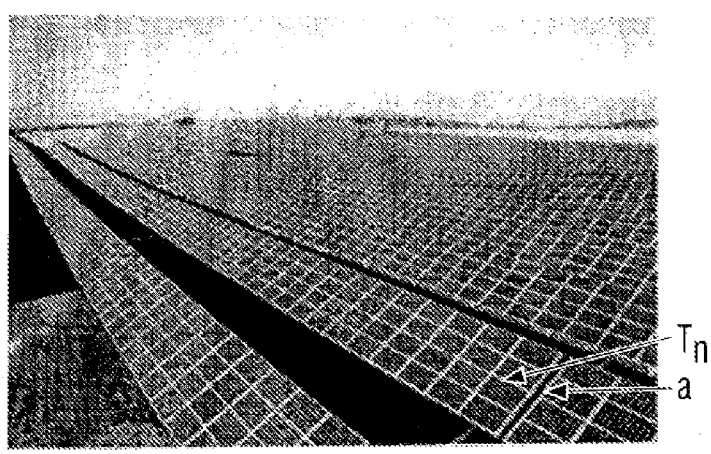

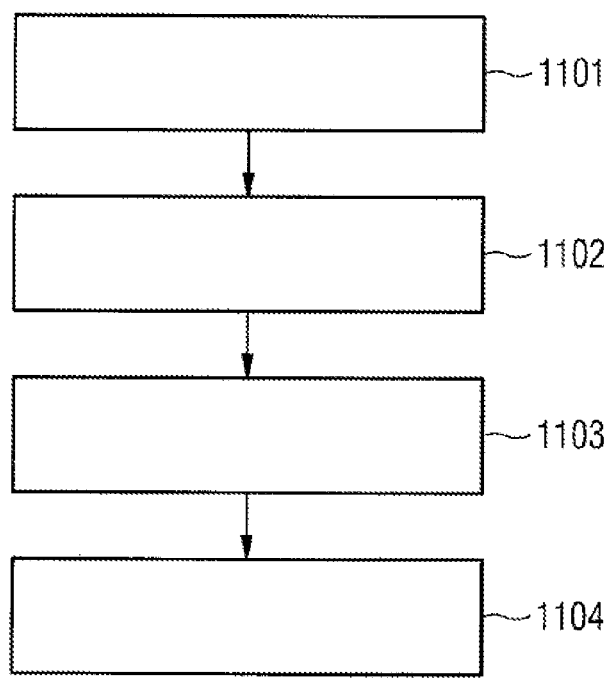

METHOD FOR DESIGNING A PHYSICAL LAYOUT OF A PHOTOVOLTAIC SYSTEM

CROSS REFERENCE TO RELATED APPLICATIONS

This application is the US National Stage of International Application No. PCT/EP2012/071908 filed Nov. 6, 2012, and claims the benefit thereof. The International Application claims the benefit of German Application No. DE 102012106124.6 filed Jul. 6, 2012 and German Application No. DE 102011055849.7 filed Nov. 29, 2011. All of the applications are incorporated by reference herein in their entirety.

FIELD OF INVENTION

The present invention relates to photovoltaic systems (PV systems) in the sense of solar-operated power stations, layout thereof, construction thereof and "optimization" thereof in view of properties of the power station, that is to say how power stations operated by gas power or carbon power or nuclear power are also to be optimized, of which the electrical power output is based on fossil or nuclear fuels.

BACKGROUND OF INVENTION

There are a large number of partly contradictory optimization objectives when constructing and designing photovoltaic systems for power generation. In order to provide a "good" photovoltaic system, a satisfactory compromise from various optimization objectives must be found.

However, existing software tools for the optimization of PV systems and the underlying concepts and methods follow a one-objective approach, as a result of which, by principle, they only assist the user of the software tool insufficiently with the configuration of the PV system. Furthermore, such approaches tend to divide optimization scope into individual criteria.

The basic principle of power generation in a photovoltaic system can be described as follows: photovoltaic modules convert incoming sunlight into direct current. Using "inverters" (that is to say DC-AC converters in the sense of power inverters), this direct current is converted into an alternating current (of the local grid frequency, that is to say 50 Hz or 60 Hz) with higher voltage, and the current thus produced is fed after a further voltage increase by transformers into the power grid of an energy supplier.

Here, the PV modules are not usually assembled individually in the developed area, but a relatively large number of modules are combined to form a relatively large module, or what is known as a "panel". A panel stands on a number of feet and for example can carry 100 modules, which are mounted on the panel in a number of rows, for example five rows, for example so as to form twenty modules in each case. The longer is such a panel, the more supporting feet it has, which can also be held in the transverse direction with struts in the manner of a base frame, or can carry the solar modules in the manner of 3D grid constructions.

Since the voltage supplied by an individual module is too small to be fed directly into an inverter, a number of modules are connected in series to form what are known as strings. By way of example, one solar panel would contain five strings each formed by twenty modules electrically connected in series, wherein the five strings could correspond to the five module rows of the panel. The strings of a panel are connected in parallel in the example. Lastly, a number of solar panels are connected in parallel to an inverter input (for example as a power inverter). Other electrical connections of the modules, for example in the form of a butterfly layout, are also possible. Here, two strings share two adjacent module rows in each case. Preferred voltage ranges of the multiplied DC voltage (multiplied by the number of modules per string) obtained in this way may lie above 500 V, preferably in the range between 700 V and 1,500 V.

For the purpose of improved utilization of the incoming solar radiation, the modules may be mounted not flat (horizontally) on the panel, but inclined by a certain angle of inclination from the horizontal in the direction of the equator, as can be achieved by different lengths of the feet or of the base frame.

The above-mentioned weak points of existing PV system optimization tools, that is to say both the insufficient decision support in the search for a compromise and also the lack of optimization scope, are to be remedied/overcome as (technical) problems.

SUMMARY OF INVENTION

A solution can be found in the claims. A computer-assisted solution is provided.

Accordingly, a method for creating a physical layout of a photovoltaic system in a specified area is proposed. The photovoltaic system is specified by a multiplicity of technical properties. The method comprises the steps of reading out more than twenty pre-calculated completed layouts for the photovoltaic system from a memory, presenting the completed layouts in a graphical presentation in such a way that each of the completed layouts is represented by at least a partial number of the multiplicity of technical properties, modifying value ranges of the presented technical properties in order to present a modified number of completed layouts comparatively, and selecting from the modified number of completed layouts a layout optimized with regard to the presented properties.

A computer-assisted multi-objective optimization of (technical) PV systems is thus proposed. The concept includes a method for generating a variety of possible PV systems in an area to be developed, and a concept for multi-objective navigation of the produced set of solutions. By this navigation, it is possible to determine from the available layouts of producible PV systems the PV system that provides the best compromise between the various optimization objectives.

With the claimed method it is possible to construct a PV system having a large nominal power in the best possible way. The physical layout of the entire photovoltaic system is adapted to the specified area.

In embodiments of the method, the completed layouts with the partial number of the multiplicity of technical properties are presented in such a way that a number of technical property scales are formed in a scale region of the graphical presentation, wherein the same technical property of the completed layouts is plotted on each technical property scale, and each presented completed layout is represented in a coordinate region of the graphical presentation by a marking and is localized in the coordinate region of the graphical presentation via at least two of the technical properties.

In embodiments of the method, the multiplicity of technical properties comprises at least one first multiplicity of solar panels arranged side by side and/or one behind the other, in each case with a surface carrying solar cells that generate electrical direct current, one second multiplicity of DC-AC converters, to which the direct current generated by the solar panels is fed via cables, and at least one transformer station, to which a high-voltage AC voltage is fed from the DC-AC converters via lines.

In embodiments of the method, the multiplicity of technical properties includes an arrangement of all solar panels in the specified area, a placement of the DC-AC converters, track guides of cables and lines, and a position of the at least one transformer station.

In embodiments of the method, the multiplicity of technical properties includes groups of solar panels, wherein each group of solar panels is assigned to a DC-AC converter.

In embodiments of the method, no more than one group of the first multiplicity of solar panels is assigned to each DC-AC converter.

In embodiments of the method, the second multiplicity of DC-AC converters is smaller than the first multiplicity of solar panels. Each DC-AC converter is fed, via cable, electrical direct current generated by its assigned group of solar panels, wherein each group of solar panels contains no more than half of the first multiplicity of solar panels and/or a nominal power of a respective group of solar panels corresponds to at least half of a nominal power of the DC-AC converter assigned to the group. The at least one transformer station is fed, via lines, the high-voltage AC voltage of at least one first group of DC-AC converters.

In embodiments of the method, the photovoltaic system has a nominal power above 2 MW.

In embodiments of the method, a limit can be set at one end or both ends on a technical property scale so as to represent in the coordinate region only the completed layouts, highlighted by a marking, of which the technical property value on the limited property scale lies within the set limits.

In embodiments of the method, two technical property scales can be adjusted jointly at one end or both ends by a respective limitation.

In embodiments of the method, the delimitation at one end or both ends is canceled so as to again present uniformly the more than 20 completed layouts in the coordinate region.

In embodiments of the method, two completed layouts of different types in principle are represented in the coordinate region by a different marking respectively and are localized via at least two of the technical properties, each along a coordinate axis, so as to be able to compare the two types of completed layouts via the two technical properties on the coordinate axis.

In embodiments of the method, one fundamental type has a more robust arrangement of the panels, less susceptible to construction faults, and the other type has an irregular arrangement of the panels, more sensitive to construction errors.

In embodiments of the method, each DC-AC converter is assigned to just one solar panel.

In embodiments of the method, the second multiplicity is less than 50% of the first multiplicity, in particular less than 10%.

Furthermore, a method for designing a photovoltaic system to be constructed with a nominal power above 2 MW or for creating a physical layout of the photovoltaic system in a specified area is proposed. The photovoltaic system or the layout comprises at least (i) a first multiplicity of panels arranged side by side with a surface carrying solar cells that, as solar panels, generate electrical direct current at a first voltage level, (ii) a smaller multiplicity of DC-AC converters, in particular inverters, wherein direct current generated by solar energy can be fed or is fed to each DC-AC converter from an assigned group of solar panels via cable, wherein each group of solar panels contains no more than half of the first multiplicity of solar panels and/or a nominal power of respective group of solar panels corresponds to at least half of a nominal power of the DC-AC converter assigned to the group, and (iii) at least one transformer station, to which the high-voltage AC voltage of at least one first group of DC-AC converters can be fed or is fed via lines, wherein, for the technical specification of the photovoltaic system, a large number of more than twenty completed layouts of photovoltaic systems, each of which is defined via at least the above-mentioned technical parameters (i) to (iii) and also a number and arrangement of all solar panels in the specified area, a number and placement of all DC-AC converters, an assignment of each group of solar panels to its DC-AC converter, all track guides of the cables and all track guides of the lines, and also the position of the transformer station, is stored in a retrievable manner in a memory module. The at least twenty completed layouts of photovoltaic systems are presented or plotted in a graphical presentation such that each of the layouts and therefore each associated photovoltaic system is represented by at least its nominal power and/or its first multiplicity of solar panels and its relatively low number of DC-AC converters as technical properties in order to make a selection or comparison from at least these properties and/or to limit a presented range of a property.

In embodiments of the method, a DC-AC converter has a nominal power between 1 kW and 1 MW, and/or a solar module has a nominal power above 200 W, and/or a solar panel has between 15 and 100 modules, and/or a panel has a nominal power above 3 kW, in particular between 20 kW and 50 kW.

In embodiments of the method, the surface of each of the panels carrying the solar cells is inclined, in particular at a fixed, identical angle for all panels.

In embodiments of the method, the angle (al) is an acute angle, in particular in an angular range between 15° and 45°.

In embodiments of the method, the nominal power of a respective group of solar panels with respect to the nominal power of the DC-AC converter assigned to the group covers a range of ±30%, preferably ±10%, compared with a precise match of the nominal capacities.

In embodiments of the method, the nominal power of a group of solar panels is more than 100% greater than the nominal power of the DC-AC converter assigned to the group.

In embodiments of the method, the specific layouts of the photovoltaic systems are not plotted in the graphical presentation, but instead only technical properties thereof.

In embodiments of the method, the first voltage level of DC voltage is below 1,500 V.

In embodiments of the method, the memory module is a database.

In embodiments of the method, less than 10% of the number of panels of a total PV system are assigned to each of the relatively low multiplicity of DC-AC converters.

In embodiments of the method, at least some of the groups of DC-AC converters are electrically connected in a ring main to the transformer station.

In embodiments of the method, more than 80% of the electric cable length in the layout of each PV system is constituted by DC cables, the rest being AC lines.

Furthermore, a method for presenting a large number of more than twenty completed layouts of photovoltaic systems on an on-screen presentation in order to assist a user when designing a photovoltaic system to be constructed with a nominal power above 2 MW or when creating a producible physical layout of the photovoltaic system in a specified area is proposed. The layout of the photovoltaic system comprises at least (i) a first multiplicity of panels arranged side by side with a surface carrying solar cells that, as solar panels, generate electrical direct current at a first voltage level above 500 V, (ii) a smaller second multiplicity of DC-AC converters, in particular inverters, wherein direct current generated by solar energy can be fed or is fed to each DC-AC converter from no more than one associated subgroup of the totality of solar panels via DC cable, and (iii) at least one transformer station, to which AC voltage of a higher voltage compared with the first voltage level can be fed from the DC-AC converters via AC lines. The large number of completed layouts of photovoltaic systems are stored in a retrievable manner in a memory for the technical specification of the producible photovoltaic system. The completed layouts are presented or plotted in a graphical on-screen presentation with a multiplicity of their technical properties, such that a number of technical property scales are formed in a scale region and the same technical property of the large number of completed layouts of photovoltaic systems is plotted on each technical property scale. Each photovoltaic system is represented in a coordinate region by a marking and is localized in the coordinate region via at least two of its technical properties.

In embodiments of the method, each of the layouts and therefore each associated photovoltaic system is represented on the technical property scale by at least its nominal power and/or its first multiplicity of solar panels and/or its low number of inverters as technical properties so as to select coordinate axes in the coordinate region for at least these properties, in particular controlled from a third region of the on-screen presentation.

In embodiments of the method, each of the layouts stored in the memory is defined via at least the technical properties (i) to (iii) and a number and arrangement of all solar panels in the specified area, a number and placement of all converters, an assignment of each sub-group of solar panels to its converter, all track guides of the DC cables and all track guides of the AC lines and also the position of the transformer station.

Furthermore, a method is proposed for presenting a large number of more than 20 completed layouts of photovoltaic systems on an on-screen presentation in order to assist a user when designing a photovoltaic system to be constructed with a nominal power above 2 MW or when creating a producible physical layout of the photovoltaic system in a specified area. The layout or the photovoltaic system comprises at least (i) a first multiplicity of panels arranged side by side and in succession and each having a surface carrying solar cells that, as solar panels, generate electrical direct current, (ii) a second multiplicity of DC-AC converters, in particular inverters, to which direct current generated by solar energy can be fed or is fed from the solar panels via DC cable, and (iii) at least one transformer station to which high-voltage AC voltage can be fed or is fed from the converters via AC lines. The large number of completed layouts of photovoltaic systems is stored in a retrievable manner in a memory for the technical specification of the producible photovoltaic system. The completed layouts are presented or plotted in a graphical on-screen presentation by a multiplicity of their technical properties, such that a number of technical property scales are formed in a scale region of the graphical on-screen presentation and the same technical property of the large number of completed layouts of photovoltaic systems is plotted on each technical property scale. Each photovoltaic system is represented in a coordinate region of the graphical on-screen presentation by a marking and is localized via at least two of its technical properties in the coordinate region of the graphical on-screen presentation.

Furthermore, a method is proposed for designing a photovoltaic system to be constructed with a nominal power of above 2 MW or for creating a physical layout of the photovoltaic system in a specified area, the photovoltaic system comprising (i) a first multiplicity of panels arranged side by side and in succession and each having a surface carrying solar cells that, as solar panels, generate electrical direct current, (ii) a second multiplicity of DC-AC converters, in particular inverters, to which direct current generated from solar energy can be fed or is fed from the solar panels via DC cable, and (iii) at least one transformer station, to which high-voltage AC voltage can be fed or is fed from the converters via AC lines. The large number of completed layouts of photovoltaic systems is stored in a retrievable manner in a memory (30) for the technical specification of the producible photovoltaic system. The completed layouts are presented or plotted in a graphical on-screen presentation by a multiplicity of their technical properties, such that a number of technical property scales are formed in a scale range of the graphical on-screen presentation and the same technical property of the large number of completed layouts of photovoltaic systems is plotted on each technical property scale. Each photovoltaic system is represented by a marking in a coordinate region of the graphical on-screen presentation and is localized via at least two of its technical properties in the coordinate region of the graphical on-screen presentation.

In embodiments of the method, each DC-AC converter is assigned to just one solar panel.

In embodiments of the method, the second multiplicity is less than 50% of the first multiplicity, in particular less than 10%.

The starting point and objective of the PV system is the outline of an area (as specified area), wherein the compass direction (north) is usually drawn (oriented) upwardly.

The computer-assisted placement and the installation of the arranged panels in the specified area result in different spacings between the panels in the north-south direction. These result from the topology of the specified area, which comprises locations with different inclination in the north-south direction.

In order to keep a shading on the panels uniform, panels in flat parts are arranged far from one another with an arrangement in the Northern Hemisphere, and panels on southern slopes are placed closely together.

The described principle of action and construction of a PV system results in a multiplicity of usable degrees of freedom in the design (and construction), for example the selection of the PV module type (modules differ from one another for example in terms of produced voltage, maximum power and degree of efficacy) and of the panel layout, including the number of module rows and the number of modules per string (differences for example with the nominal voltage).

A further usable degree of freedom is the selection of the inverter type (differences for example in a nominal or input power and a degree of efficacy).

A further usable degree of freedom is the selection of the number, the positions and the angle of inclination of the panels in the PV system (differences for example in the course of the output power over the day, corresponding to the course of the sun, and in the strength of the mutual shading of the panels).

A further usable degree of freedom lastly is the selection of the number and positions of the DC-AC converters, for example as inverters, in the PV system and also of details of the electrical wiring of the components (differences for example in the degree of efficacy of the overall system, the technical outlay, and the assembly effort when constructing the system).

Due to the multiplicity of degrees of freedom, there is a large range of possible PV systems in a specified area to be developed. The individual systems here behave differently with regard to different decision-relevant technical properties, which often correspond directly to the optimization objectives (by being maximized or minimized).

Here, the (technical) nominal power of the system, the (technical) annual yield (produced energy in kWh—kilowatt hours) the technical outlay (number of required components, complexity of the wiring) and the effort in terms of the assembly and the maintenance of the system (robustness or sensitivity) can be cited by way of example.

The magnitude of the individual technical properties (and therefore the fulfillment of the optimization objectives) of a PV system are dependent here in a complex manner on technical parameters. The technical parameters are additionally influenced by the topology (ascending or descending slopes) of the specific area, the course of the sun, corresponding to the latitude at the location of the specific area, and the typical weather conditions over the area.

It can be said that the optimization of a PV system is characterized by a wide range of possible technical parameters (properties), various ambient influences and complex dependencies between the degrees of freedom. The builder, designer and planner of a PV system therefore require good assistance.

A variety of PV systems are generated covering the range of possible solar power stations in the specific area. As a result, the optimization scope is shown in terms of the individual technical properties, and an overview of alternatives is obtained so as to enable the following.

Assessment of the individual alternative PV systems on the basis of decision-relevant technical properties. It is thus possible for the builder, designer and planner to understand the complex dependencies between ambient influences, degrees of freedom and technical properties (visually and in an easily accessible manner), wherein these would not be identified without this visual assistance or would be misinterpreted. Such an optically conveyed understanding is fundamental to arriving at the best PV system, which is also constructed. In this sense, the optimization tool is a highly qualified GUI (graphical interface) for the user, which conveys knowledge to the user concerning relationships in the PV system of the specific structure, which the user "himself" cannot discover/would never have discovered, even with experience and technical expertise.

Navigation through/with the variety of PV systems. Here, the user is suitably assisted in constructing the best power station from the multiplicity of possible power stations. The finding of a compromise between the various optimization objectives is accompanied and assisted here by functionalities. Without such assistance, it is not possible to select from possible alternatives the correct alternative with the complex relationships between degrees of freedom and technical properties.

Due to the presence of conflicting optimization objectives in the context of the PV systems, an individual solution may not be good simultaneously in all optimization objectives, but represents a certain compromise between the objectives. However, this compromise generally is not that which would be the best compromise in the specific application. This best compromise, for example given by a weighting of the various optimization objectives in accordance with their importance or by the desired values of the solution in the individual objectives, cannot be defined a priori. Therefore, the best compromise when establishing the individual solution(s) cannot be taken into consideration, and consequently the individual solution calculated by a single-objective algorithm will be sub-optimal.

Requirements may be placed on the components to be used, such as module type and inverter type (as an example of a DC-AC converter).

With regard to the physical degrees of freedom (with regard to components to be used, number and positions thereof, type of electrical wiring thereof), sensible value ranges for technical properties may be specified, within which various technical properties are used for alternative PV systems with a selectable resolution.

The generation of the variety of PV systems itself can be configured, that is to say technical degrees of freedom can be set. For example, it is possible to define how many solar panel columns are in a column group and which column groups extend over the specified area.

With use of typical weather data for the specific area, the physical processes for the operation of a PV system are simulated in order to arrive at a substantiated prognosis of the annual yield thereof.

Apart from the annual yield, further technical properties can be "predicted" (determined in advance), such as the genuine, actual peak power (real nominal power) or the degree of efficacy of a constructed PV system. Such technical properties lead to a best design of a PV power station.

Starting from an interesting PV system from the variety of alternatives of completed layouts, "certain manual post-processing procedures" can be performed nonetheless, which ultimately lead to a constructed PV system.

Certain manual post-processing procedures are minor modifications, for example the shifting of individual panels, deletion or addition of individual panels, or also changing the assignment of individual panels to a converter, in particular inverter.

A PV system with a large nominal power can be constructed in the best possible way with the claimed method. The physical layout of the entire photovoltaic system is adapted to the specified area. A layout of a system fundamentally includes technical variables, that is to say technical parameters in the sense of technical properties of the system. A multiplicity of erected solar panels are provided, each of which generates direct current when it is irradiated with sunlight on a light-sensitive surface. These surfaces are solar cells, organized in modules. The next highest organization is the arrangement of the solar panels, which are not placed uniformly in the total specified area, but are placed in a manner dependent on the multiplicity of the defined technical variables, that is to say their spacings, their column organization and their assignment to specific DC-AC converters present in a smaller multiplicity. Each of these converters receives current at a plurality of solar panels, which thus form a group. Such a group has fewer solar panels than the entire number of solar panels of the entire PV system.

In other words, the assignment of the nominal power of a respective group of solar panels to a converter may also be an indicator for the number of assigned panels. A possible design is to adapt the nominal power of the group of solar panels to the nominal power of the DC-AC converter. However, this technical design is not always the most favorable, and an under-occupancy or over-occupancy may also be provided. Starting from future developments, which appear to indicate that solar cells are much more cost effective, and assuming that DC-AC converters are already relatively well developed and are unlikely to change in terms of price, it is technically clever to assign more solar panels to a DC-AC converter than allowed by the nominal load thereof. Here, it is assumed that not all solar panels can operate at full nominal power over the entire day, such that the nominal power is exceeded at certain times of the day and at other times of the day is only reached as a result of the "overbooking" of the converter with nominal power from solar panels. Here, indicators include the fact that a converter should not be underutilized by less than 30% (insufficient assigned nominal power of solar panels), but can be overbooked by more than 100%, that is to say approximately twice the nominal load of solar panels can be assigned to a DC-AC converter by the aforementioned group formation.

On the basis of a division by half of present solar panels of the PV system, a first inverter thus obtains no more than half the totality of the solar panels, and a second inverter obtains no more than the other half of the solar panels. A group of inverters is then formed, and the same number of groups of solar panels is formed.

The group of inverters feeds the converted energy, transferred from DC to AC and with the voltage level raised, to a transformer station. This transformer station forwards the AC voltage to a synchronous grid at the voltage of the location at which the PV system is erected. The lines which guide the AC current from the inverters to the transformer station are preferably formed as a ring main, which leads to increased reliability. If the ring main is interrupted at one point, all DC-AC converters can nevertheless feed their current to the transformer station via the remaining part of the ring.

The group formation results in a much shorter cable length for the AC line compared with the necessary cable length for the wiring and for the connection of the solar panels. The claimed number of more than 80% in favor of the DC cable may also lie above 90% in power stations. This is then also true when ring mains are used for the AC lines.

A large number of completed layouts of photovoltaic systems is claimed, wherein the large number comprises a number in any case of more than 20, mostly more than 100 completed layouts. The size of this number is determined via the number of alternatives suitable for the specified area on which the PV system stands. Each layout of a photovoltaic system is specified precisely by technical parameters, that is to say a specific number and arrangement of all solar panels in the PV system suitable for the specified area, the number and placement of all DC-AC converters, the assignment of each group of solar panels to its DC-AC converter, all track guides of DC cables and all track guides of AC lines, and also naturally the position of the transformer station. The PV system is thus specified technically, has a nominal power, a yield and many other technical variables that define it (in an abstract manner). It is not the specific layout of the system that is presented on the display screen, but instead the technical properties of the specific layout. This large number of PV systems are all stored in a retrievable manner in a memory module and can thus be retrieved and presented, but not specifically in terms of their design, but abstractly in terms of their technical properties.

These technical properties are presented or plotted in the graphical presentation. Each layout and therefore each PV system here has a nominal power which is referred to as P.

By way of example, the PV system 100 has the power P 100. Also, a first multiplicity of solar panels is a variable that is determined technically and presented graphically. If the number of panels is N, the number of panels in the PV system is thus 100 N 100. A lower number of DC-AC converters is provided as a result of the group formation of the solar panels and the assignment of a respective group of solar panels to a respective DC-AC converter. This number is referred to as M100 for the PV power station 100.

The number of panels, the number of converters and nominal power can be selected, simultaneously presented and compared for the stored large number of more than twenty completed layouts of PV systems on the basis of these technical properties. Certain ranges of properties can be limited so as to present on the presentation arrangement only a reduced number of the large number of PV systems. The limitations can also be canceled again.

Technical variables and specifications of these PV systems are assigned in accordance with the components of said systems.

The solar panels have a surface carrying the solar cells or a frame, which supports the solar cells. They can be oriented horizontally or in an inclined manner, and are usually arranged for an entire PV system in the same inclination. This inclination may lie in an angular range between 15° and 45°. It is dependent on the geographical latitude at which the PV power station is installed. The surface of the solar cells, usually organized in modules, is directed here southward toward the equator, and the further north the PV power station is constructed, the greater is the inclination of the framework (or surface) carrying the solar cells.

A conventional embodiment of the solar modules and their electrical circuitry is such that the first voltage level of the DC voltage received by the DC-AC converters is no greater than 1,500 V, but in particular is greater than 500 V.

This voltage is usually defined by the voltage of a panel. Here, solar panels are not connected in series, but only in parallel in accordance with current design. The voltage of a panel therefore defines the first voltage level, the power of which however is increased by the number of panels connected in parallel and the number of DC-AC converters. This power, as nominal power, is in turn dependent on the size of the specified area and also the closeness or density of the arrangement of the panels in this area.

Due to the size of such a power station having at least 2 MW as nominal power, the number of groups of solar panels is very high. A DC-AC converter is particularly assigned less than 10% of the number of panels of the entire PV system, usually much fewer.

The claimed invention will be explained and supplemented hereinafter on the basis of a number of exemplary embodiments.

BRIEF DESCRIPTION OF THE DRAWINGS

FIG. 1 shows a construction of the computer system with a memory 30 and a presentation arrangement 34.

FIG. 5D shows a different adjustment of the scales in the region 35 and a different selection of two technical properties in the coordinate region 34a.

FIG. 7 shows three images of an actual existing PV system, on which the surface occupied by solar panels $T_n$ can be seen, the spacing d between the solar panels can be seen, and the adaptation of the solar panels to the topology course, as well as the placement of inverters $I_m$, each of which is assigned an entire group of solar panels, can also be seen.

FIG. 8 shows a schematic flow diagram of an exemplary embodiment of a method for creating a physical layout of a photovoltaic system in a specified area.

DETAILED DESCRIPTION OF INVENTION

Figure 2A:
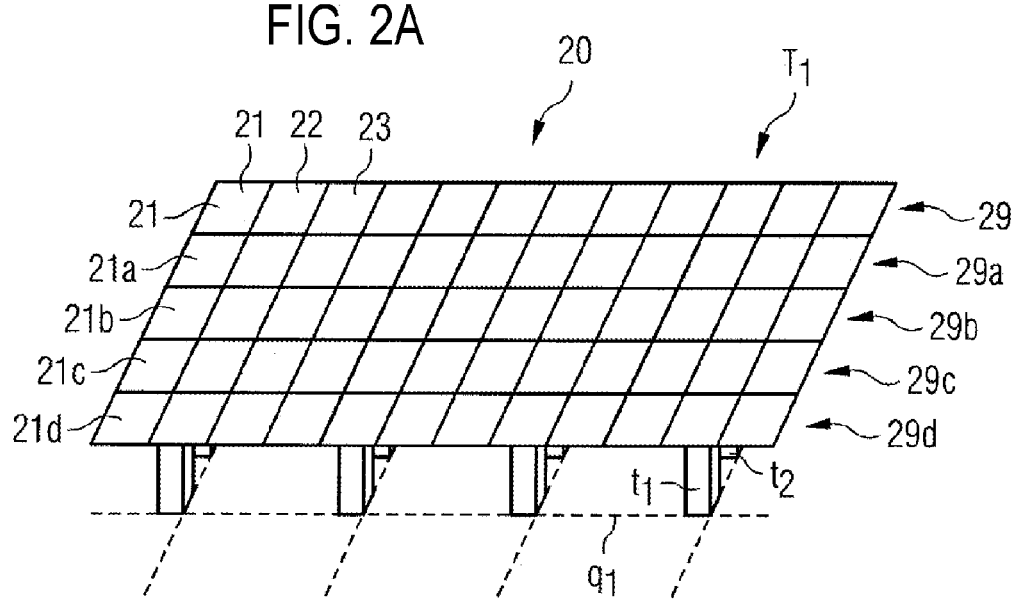
FIG. 2A shows a perspective illustration of a panel $T_1$, which comprises a multiplicity of solar modules 21, 22, 23, etc. on a supporting frame, wherein the entire coverage of solar modules is denoted by 20.

FIG. 1 shows a memory module 30, in which a multiplicity of layouts are stored digitally. This memory may be formed for example as a database. The layouts, stored in the memory, of PV systems 100, 100, 102, explained later, which have been constructed in this example in a "computer-assisted" manner by a first computer, are read by a second computer 32 and are presented on an on-screen presentation 34.

The on-screen presentation 34, which may be a printout or a presentation on a display, has at least two highlighted regions, that is to say a coordinate region 34 and an axis region 35, in which a multiplicity of parallel axes, illustrated as graphically represented sliders (axis with graphic slide buttons) are plotted.

In an example (not illustrated), the layouts of the PV systems, which are stored in the memory module 30, can also be constructed and stored by the computer 32 for computer-assisted reading by the same computer 32 and suitable presentation on the presentation arrangement 34. The first computer 31 is then dispensable for the prior calculation or pre-calculation of the layouts.

Figure 2B:
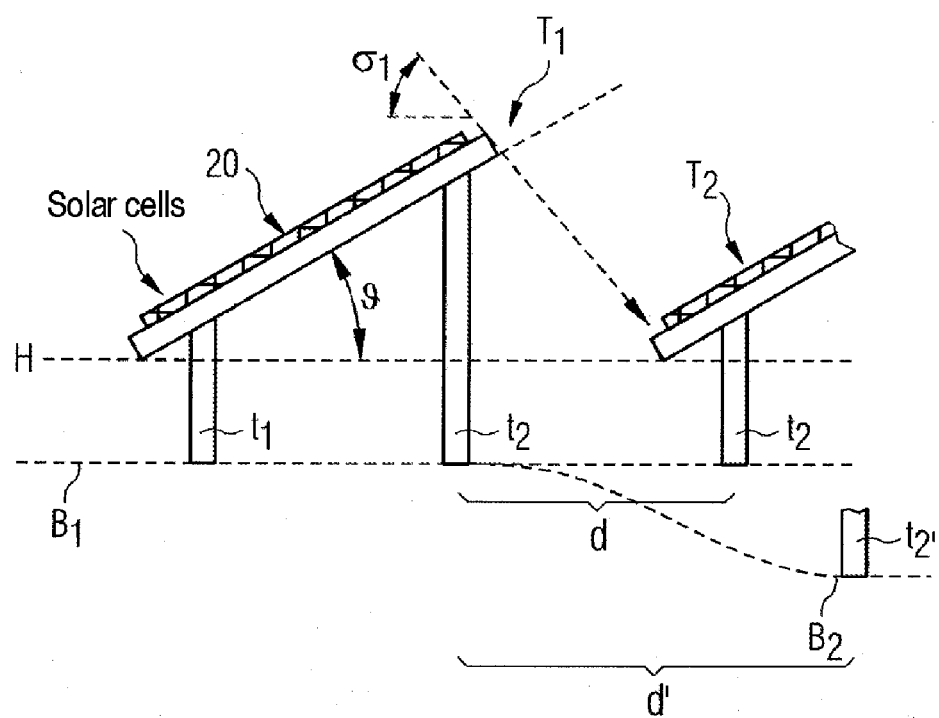
FIG. 2B shows a side view of FIG. 2A, wherein two panels $T_1$ and $T_2$ distanced to the right are illustrated and the spacing is denoted by d. In an alternative, with a modified course of the terrain from $B_1$ to $B_2$, the second panel $T_2$ is arranged lower, represented by its supporting foot $T_2'$, and IS distanced further from the first panel $T_1$, characterized by the spacing d'.

The solar panels $T_n$, which in the example are illustrated as two panels $T_1$ and $T_2$ in FIGS. 2A and 2B, are those that carry a multiplicity of solar cells 20 on a surface. These solar modules may be organized differently. Currently conventional organizations are arranged such that a number of rows 21, 21a, 21b, 21c, 21d of solar modules are organized and are placed on the upper side of the panel T1 so as to cover the surface thereof. They are electrically connected on the underside, either all solar modules in a row being connected in series or alternately by interleaving different modules from adjacent rows 21, 21a and series formation.

The delivered voltage of each solar module 21, 22, 23 can thus be added, such that a voltage is produced along a "string", for example 21 or 21a, and corresponds to the inherent voltage of a module, multiplied by the number of modules connected in series. The DC voltage thus formed, which is not altered by parallel connection of the number of strings, but is only increased in terms of its deliverable current, is not above 1,500 V in currently conventional systems. It is a DC voltage that is generated by the incident solar energy.

The various rows 29, 29a, 29b (and others) are placed in the illustrated example on an inclined surface. This inclination may be of differing size depending on the location of installation of the PV system. It may also be close to 0° when the solar panels T are installed in the vicinity of the equator. It preferably has a small angle of inclination so as to counteract damage during use and for example so as to allow water to run off. The further north the solar system is placed, the greater is the inclination θ (theta) which the solar cells 20 on the flat side of the panel have with respect with the horizontal H.

If the system is installed close to the equator, an angle of inclination close to 0°, usually above 10°, is used so as to attain a self-cleaning effect when water hits the solar cells 20 and should run off.

Systems that are installed further north have a greater angle of inclination between 40° and 50° for PV systems that are equipped with solar panels according to FIGS. 2A and 2B and for example are installed in Sweden (>60° north). In central Europe with a latitude of between 45° and 55°, the angle of inclination of the solar surface 20 will be between 20° and 40°. Specifically, a range around 30° inclination (±10% deviation) may be suitable for Munich (approximately 48° latitude).

The solar surfaces 20 are oriented here in a southern direction (toward the equator) and preferably have the same inclination throughout the PV system.

This inclination constitutes a technical property value, which can be supplemented by the shade angle (shadow angle) σ (sigma), which may also be the same for an entire system. This angle is represented in FIG. 2B as $\sigma'_1$ (sigma1) and passes from the upper edge of one panel to the lower edge of the following panel $T_2$. The distance between the two panels $T_1$ and $T_2$ illustrated in FIG. 2B is defined by this angle and is also dependent on the way in which the topology changes.

The solar surface structure mounted on a frame with the solar cells 20 stands either on a number of feet or on a frame that is also stabilized in the transverse direction by crosspieces $q_1$. The two feet $t_1$ and $t_2$ illustrated by way of example contribute via their different length to the angle of inclination θ (theta).

If the course of the terrain $B_1$ changes in an area to be occupied, as is illustrated in FIG. 2B, the distance between the panels also changes in a manner predefined by the shade angle $\sigma'_1$ (sigma$_1$). The next panel is placed at a distance d' when the terrain changes downward, as is illustrated by $B_2$. The associated foot $t_2'$ is lower and, due to the predefined shade angle, the distance d' changes compared with the shorter distance d when the terrain $B_1$ remains at the same height.

Figure 3:
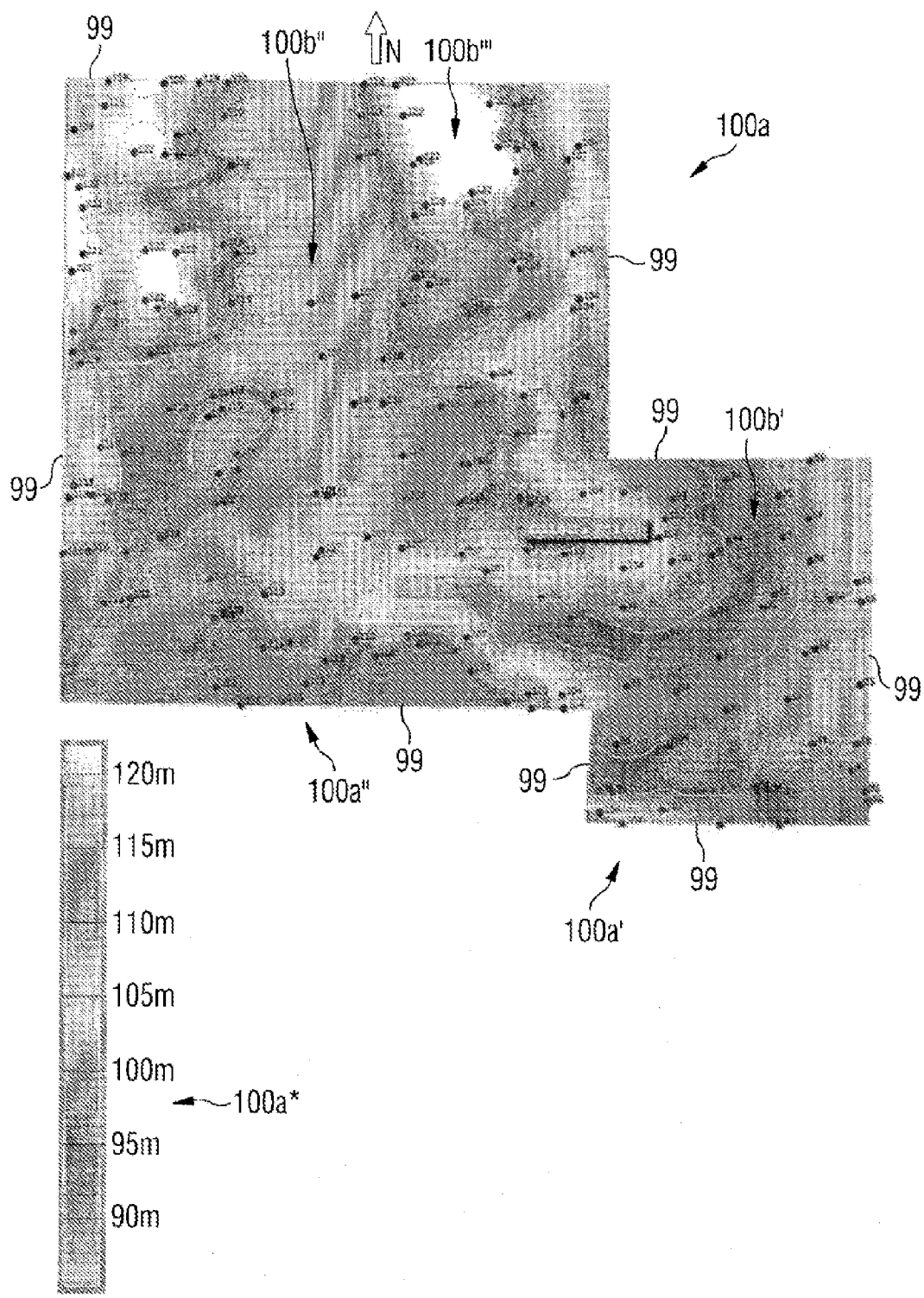
FIG. 3 shows a topology of an area 100a, in which the PV power station, a photovoltaic system, for example 100, is to be erected and is erected. The topology of this area is illustrated by contour lines. 100a* represents the height values between 90 m and 120 m belonging to the gray values.

In the example of FIG. 3, a specified area 100a is shown, which is the location and area of the photovoltaic system to be erected and that is erected. This specified area comprises two contiguous rectangles 100a' and 100a". Contour lines are illustrated. In addition to the contour lines, distributed peaks are also used for understanding. At the bottom, a height scale 100a* between 90 m and 120 m in steps of 5 m is shown (the gray value of the height corresponds to the corresponding gray value in the specified area) 100a.

In particular in the smaller right-hand rectangle 100a', lower areas around 91 to 94 m height are illustrated, and the associated region 100b, delimited by two contour lines, is visible and runs from north to south.

In the larger, left-hand rectangle 100a", a very large plateau 100b" can be seen, which extends approximately centrally from top to bottom (north-south) and lies in the height range of 107 m (middle gray value in accordance with the height scale 100a*). A smaller area 100b''' arranged very high can be seen in the right-hand upper portion (in the north-east) of this larger rectangle 100a", the height of said area as a plateau position lying at 122 m (gray value in accordance with the upper end of the height scale 100a*).

This specified area is defined and limited by the edge 99 of the two rectangles and is (will be) developed by a photovoltaic system 100.

With this development, not only are the local conditions, national provisions and tender information to be taken into consideration but in particular the geometric form (outline 99) of the specified area 100a, the topology of FIG. 3, and the orientation of the area in the compass direction given by north-south here. Geographical conditions in the sense of a latitude and weather data known for this geographical position on the Earth for at least a number of past years are also to be taken into consideration.

Here, it is also important to know whether the area 100a is a specified area in the Northern Hemisphere or Southern Hemisphere. In the illustrated example of FIG. 3, the specified area is in the Northern Hemisphere and is therefore favorable in terms of topology, since the higher regions 100b''' are arranged further to the north and the lower regions 100b" and 100b' reach further to the south. The surfaces 20 carrying solar cells to be installed and oriented in this area are illustrated as individual solar panels in FIG. 2A and FIG. 2B.

In a PV system 100 (also; "power station" L, not illustrated here initially), a large number of solar panels are distributed in a specified (usually spatially delimited) area with the objective of optimizing a multiplicity of criteria of the PV system.

An example of such a photovoltaic system over approximately 70 hectares is presented in images at www.siemens.com/photonews/pn201105d. This system produces 31 MW from solar cells. In "Google Earth", the above system still under construction can be seen at the coordinates 44.009420, 6.015299 (at 04190 Les Mees, France), also illustrated here in FIG. 7. Panel rows and columns are still under construction, however the borders (which are in no way formed by straight lines) of the specified area can be clearly seen (brown-green transition).

With the invention described here, reference is only made to those PV systems that can be referred to as industrial photovoltaic systems with capacities above 2 MW as far as ranges above 1 GW. For these capacities, a large number of panels are to be distributed in the specified area 100a, more specifically distributed such that they are placed with the geographical position, that is to say aligned with the normal sun course and oriented as favorably as possible with regard to the weather conditions, and are installed in a manner organized in terms of their spacings.

Figure 4A:
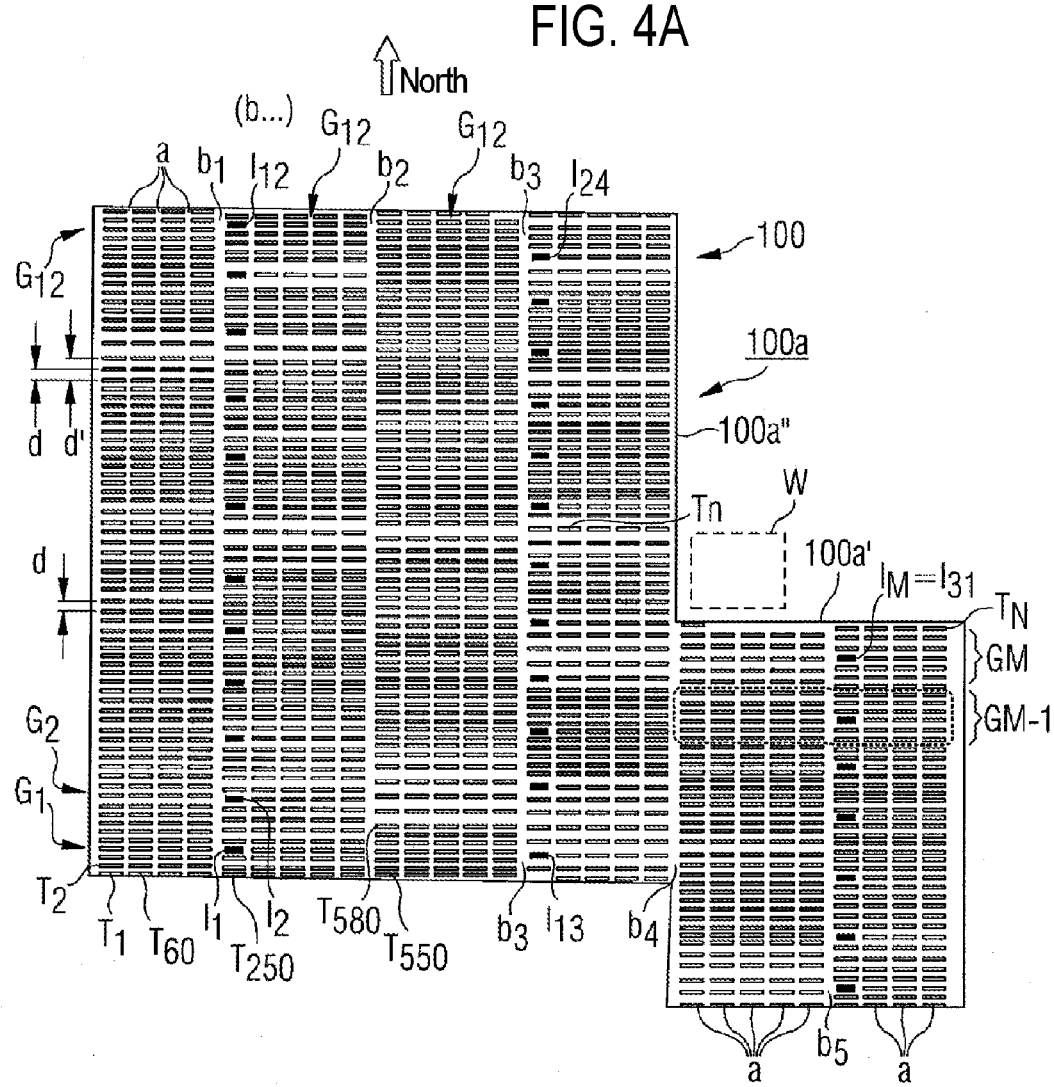
FIG. 4A shows a layout 100 of a first PV system, which is represented by a multiplicity of panels $T_n$, starting here for example with the panels $T_1$, $T_2$ (bottom left-hand corner). The panel course is organized in columns; one panel has a given width and another panel has a certain spacing d from the previous panel, as explained on the basis of FIG. 2B. The PV system of FIG. 4A has 1685 solar panels.
Figure 4B:
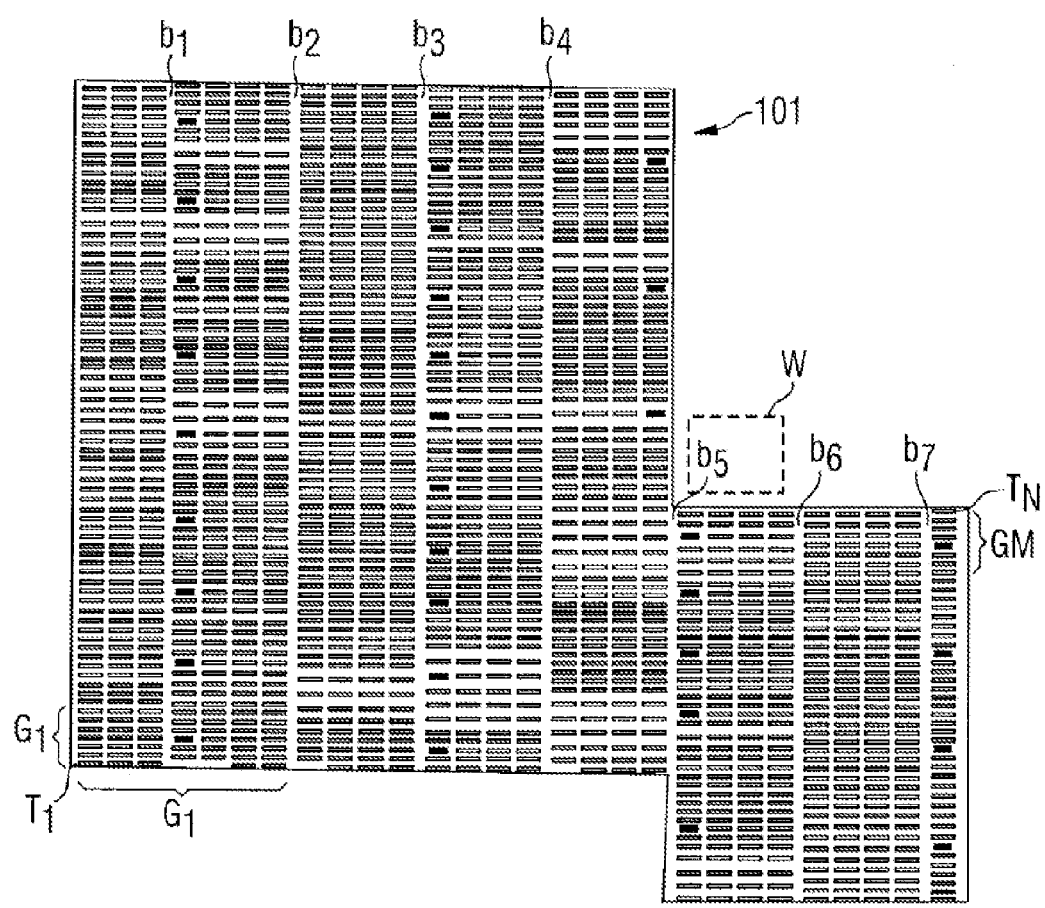
FIG. 4B shows a second PV system 101, also represented by its solar panels and the arrangement of these solar panels $T_n$, wherein the area 100a is the same. This layout of a PV system has 1719 solar panels.
Figure 4C:
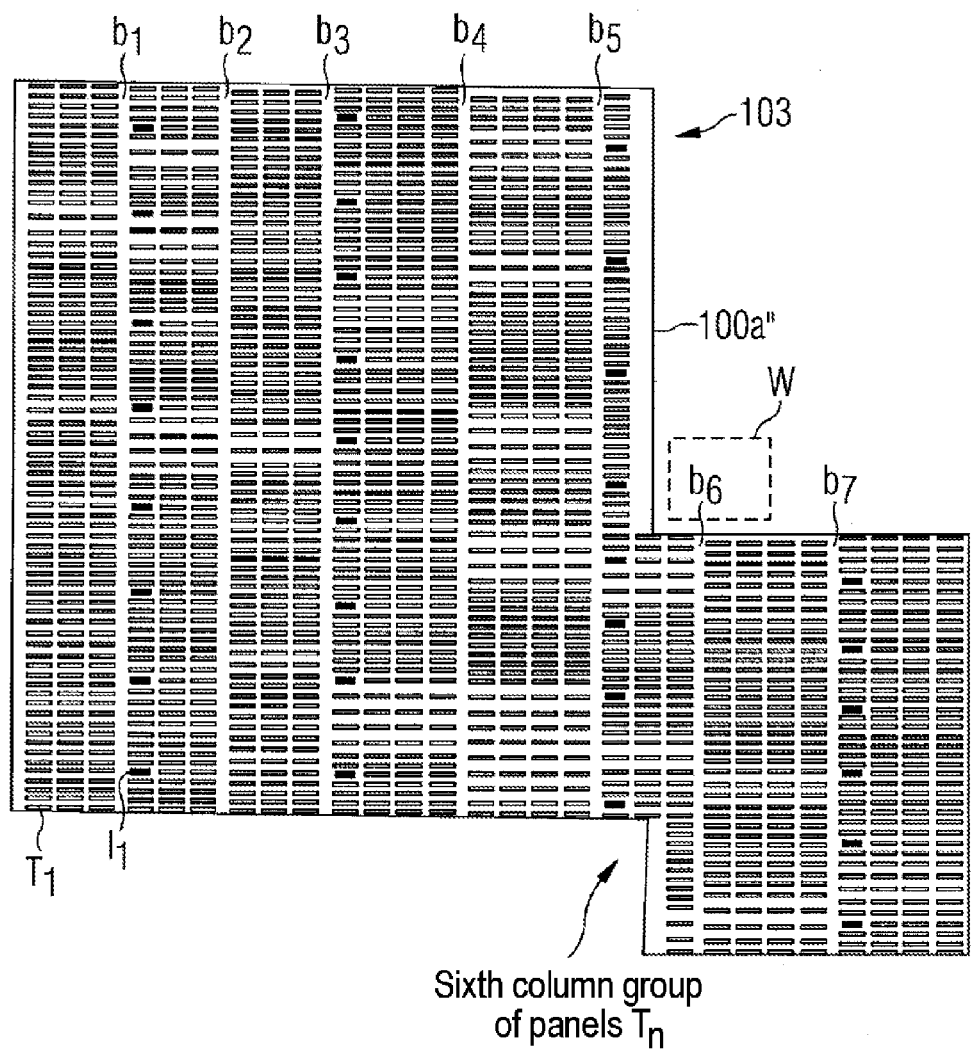
FIG. 4C has 1671 solar panels and represents the PV system 102, which likewise fits in the area 100a of FIG. 3.
Figure 4D:
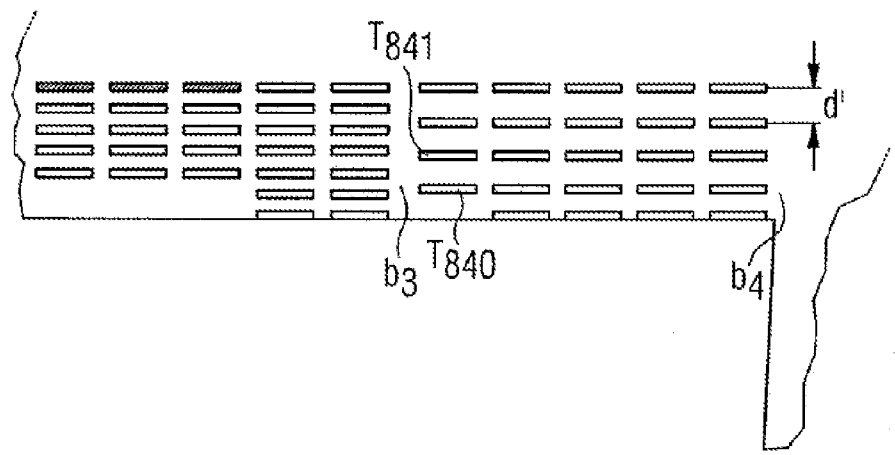
FIG. 4D shows an enlarged detail of FIG. 4A in the region of the lower inner corner at $b_4$, wherein the inverter $I_{13}$ has not yet been placed, and only solar panels are illustrated.
Figure 4E:
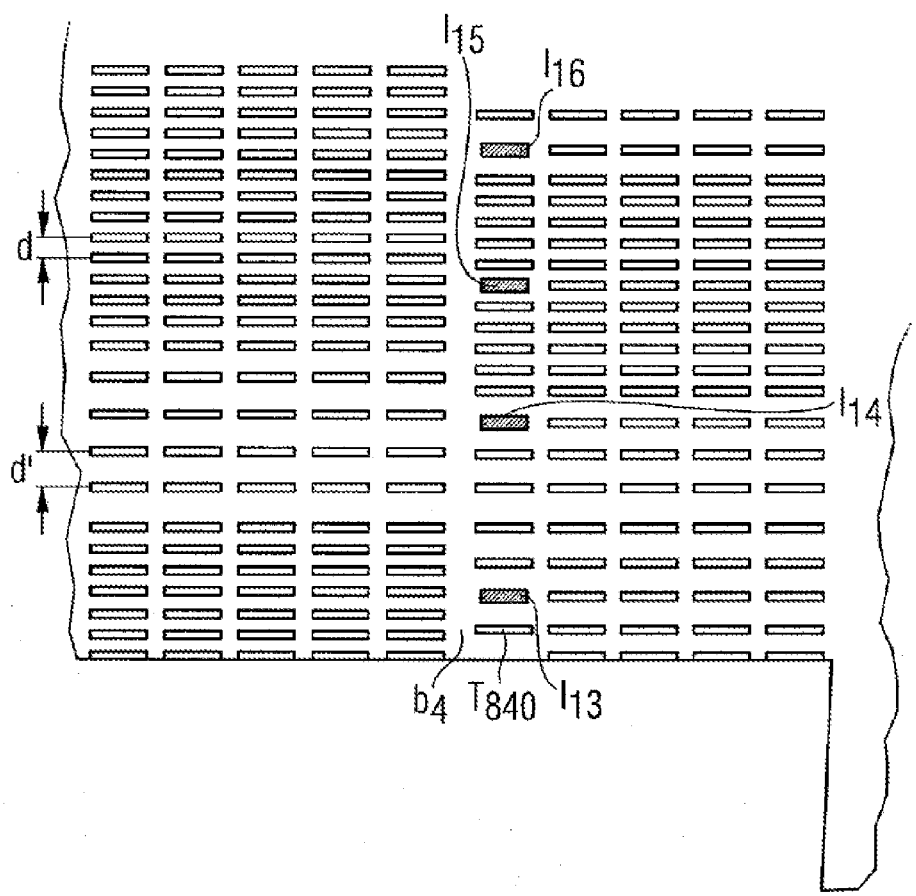
FIG. 4E shows an extended detail of the same region of FIG. 4A, here with placed inverter $I_{13}$, which has been placed at the location of a panel, specifically the solar panel $T_{841}$.

The installation of the panels $T_1$, $T_2$ and many further panels $T_n$, with a general control variable n from 1 to N, is illustrated schematically on the basis of three layouts of power stations 100, 101 and 102 in FIGS. 4A, 4B and 4C.

The actual panels are represented by short line pieces, laid out in a row along a first column, and a second column of panels is arranged next to the first column with a spacing "a" and in parallel. There are a large number of symbolic spacings a between the first four columns of parallel panels T, and there are actual spacings b, which in each case separate (space) a first group of panel columns from a second group of panel columns.

In the configuration of the physical layout, the PV system 100 is not illustrated in FIG. 4A, but is merely represented by the position of panels T, and by the position of inverters I, represented by explicitly referenced inverters $I_1$, $I_{12}$ and $I_M$, wherein M is the control variable, and a transformer station W. FIG. 4A represents a PV system 100 with 1685 solar panels, which are all covered by solar modules 20, which are connected in series in strings on a respective solar panel, and a number of strings are connected in parallel on the solar panel. Voltages are produced in the range between 700 V and 1,500 V, preferably in the voltage range between 800 V and 1,000 V DC.

Five spacings b ($b_1$, $b_2$, . . . ) are illustrated and in pairs frame a group of panel columns, wherein, in the larger rectangle 100a", three parallel column groups each with five parallel columns of panels are formed. Similarly, at the west edge of the smaller rectangle 100a', a group of five vertical panel columns is also constructed between the fourth and the fifth column group spacing $b_4$, $b_5$.

The placement of the solar panels, the arrangement of the inverters (black rectangles) and the spatial configuration of the columns for filling the area 100a represent the configuration and therefore the physical layout of the power station 100. A separately illustrated transformer station W is placed in the inner corner between the small and the larger rectangle. Here, all electrical lines lead to the inverter $I_m$.

The DC cables of the individual panels are fed to the inverters, either in a grouped or sub-grouped manner or in a manner organized in grids. It can also be seen that a respective group of panels is assigned to an inverter and the DC cable of this group is fed to this inverter. For the inverter $I_1$, this is shown for the group $G_1$, which has a gray shading different from the group $G_2$ (above the group $G_1$) fed to the inverter $I_2$. Further groups can be identified on the basis of the different gray shadings of the solar panels, such as the group of panels $G_{12}$ assigned in the top left-hand corner to the inverter $I_{12}$. The group $G_M$ of panels is assigned in the top right-hand corner to the inverter $I_M$ and extends over two column groups. The solar panels thus form sub-groups, by each of which (only) one inverter is fed with solar generated DC current. The panel sub-group may therefore also be referred to as "inverter area", for example $G_{M-1}$ (symbolized by a dotted line).

An inverter $I_m$ may also be assigned solar panels over more than one column group, for example the area $G_{12}$ may be assigned to the inverter $I_{12}$, or $G_M$ to $I_M$.

The number of panels to be arranged (or that are arranged) side by side in the transverse direction is also defined on the basis of the width of a respective column group. Here, it is assumed that the number of panels to be assigned to the column group is always arranged side by side and in alignment in the transverse direction. As can be seen in FIG. 4A, the relatively straight-running central area 100b" is assigned to the second column group (lower left-hand panel $T_{250}$) and has five panel columns placed side by side.

The spacing b of the panels in the direction of the panel columns (south-north) is oriented toward the geography (contour lines) of the specified area 100a, which can be seen as a result of the fact that the panels in the third column group are initially staggered slightly from one another with further spacing because there is a slope in the three-dimensional topology. A closer arrangement of solar panels can be seen for example in the fourth column group (to the left below the inner corner with the transformer station W), which can be attributed to an ascent of the terrain 5, and a subsequent descent of the topology leads to larger spacings between the individual panels along a respective column.

Since the panels are always to be arranged in alignment in a transverse direction (within a panel column group), topology-associated influences may lead to a reduction of the number of panels that can be placed in the specified area.

An embodiment of another power station 101 can be seen from FIG. 4B. this photovoltaic system 101 has 1719 solar panels $T_n$ and functions with eight column groups, is organized differently and has no column groups with five panels arranged side by side, but has column groups with a maximum of four panels arranged side by side.

The layout of the power station 101, in accordance with calculations, promises a greater yield, although more vertical column spacings b, which take up space, are provided. The column groups, however, are not so wide, and therefore the panels can be better adapted to the topology in terms of their spacings in the vertical direction (south-north) than if they were to be adapted to the topology in greater widths in accordance with FIG. 4A (second to fourth column group).

In this respect, an aligned orientation of a panel row (within a column group) running in the transverse direction is always key, these panel rows being better adapted as a result of the plurality of column groups in the layout of the power station 101. Here, the panels are arranged more densely, and a larger number of panels is placed in the same specified area 100a than is possible with the photovoltaic system 100 with the layout according to FIG. 4A.

Further embodiments, that is to say a further PV power station 102, can be constructed in accordance with the examples of FIGS. 4A and 4B. FIG. 4C shows a PV power station 102 with 1671 panels, that is to say fewer than in the two other layouts 100 and 101.

At least three layouts or technical specifications or physical layouts of three PV systems with a power above 2 MW can be seen from FIGS. 4A, 4B and 4C. Further, these can be constructed and also are constructed, such that a multiplicity of previously defined power stations of which the exact configuration is defined are held available and stored in a memory, for example in the form of a database 30.

These previously defined PV systems are calculated by a first computer 31 and are stored in the aforementioned database 30. A second computer 32 reads these predefined PV systems and presents them on a graphic display 34.

The presentation may vary and comprises a presentation of the multiplicity, preferably all, of the PV systems contained in the database, but not their spatial/geometric configuration (their physical layout), but a representative presentation in the coordinate region 34a, that is to say illustrated in the example such that each point shown (as the example of a marking) is representative of a PV power station (a PV system 100, 101, 102, . . . ). Technical properties of the power stations are presented in the scale region 35 on sliders (graphic slide controllers) illustrated in the example, these technical properties being represented symbolically by only a point in the image region 34a.

From this, the group of at least twenty, preferably more than one hundred and even many more pre-calculated PV systems can be seen, which are presented together on the graphic display 34.

Variables, such as number of panels, number of inverters, angle of inclination of the surfaces carrying the solar cells, shadow angle or nominal power of the respective PV system are represented by individual scale marks on the sliders in the "working region" 35 (comprising the scales), which can be seen beneath the x/y presentation 34a.

Other technical properties of the PV systems can be included, and more complex variables and also other assessment variables can be presented. Examples of such variables include the degree of efficacy, the expected yield per year (yield post inverter), the LCOE (levelized cost of electricity), the yield per watt peak (kWh/Wp, peak=nominal), a sensitivity of the PV system to fluctuations in weather, a sensitivity of the system to faults in the technical construction (considered structurally) or degradation of the system.

These are all parameters that describe a PV system 100, 101, etc., and also define it abstractly, just as a vehicle can be defined by horsepower and maximum speed and consumption. This has been symbolized for the specific physical layout illustrated on the basis of FIGS. 4A, 4B and 4C.

The pre-calculated solutions are sensible, but are not the best solutions in every respect. The pre-calculated solutions stored in the memory 30 (database) concern the plot of land on which the power station is erected, concern the panel placement, which occurs panel by panel, concern an inverter area (the definition of a respective area that comprises a group of panels which may also span column groups) and also the placement of the inverters, and concern the electrical cabling, wherein both the AC voltage lines and the DC voltage cables are concerned. Here, the electrical wiring comprises the routing of the lines/cables and also the dimensioning of the lines/cables.

The DC voltage cables lead from the solar cell modules on the panels installed side by side to the inverters, wherein one or more intermediate junction boxes 70 can be provided and are referred to technically as GJBs (generator junction boxes). Such a GJB always combines a number of cables form a number of solar panels $T_n$, see FIGS. 4F and 4G. Continuing this further, a number of cables of GJBs from other GJBs are combined, such that all are guided together to an inverter (provided the solar panels are assigned to this inverter), which generates from the DC voltage an AC voltage of higher voltage. A first junction box AJB (array junction box) is usually provided on a solar panel.

The inverters are generally self-guided inverters, which convert to the nominal frequency of the photovoltaic system and convert to an intermediate voltage, in Europe usually in the region of 15 kV, per AC transformer. Each converter is connected via one or more further AC voltage lines to the transformer station W, via which the PV system outputs its electrical power, more specifically in a grid HS of even greater voltage in the range of overland lines from 110 kV to 330 kV (European synchronous grid), and in the USA already from 30 kV.

Figure 4F:
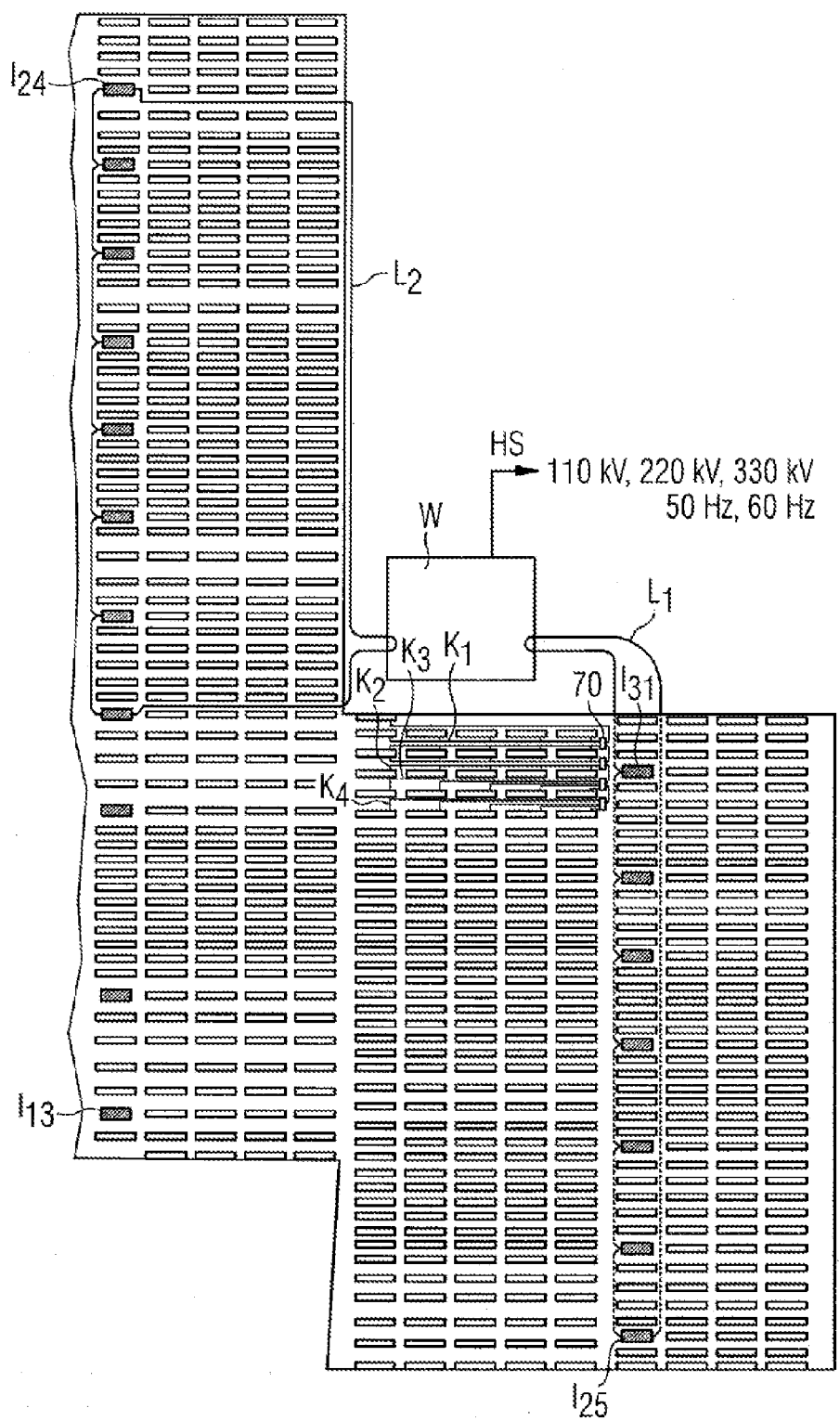
FIG. 4F shows a cabling (in the sense of an electrical wiring) of a multiplicity of panels to an inverter, here $I_{31}$, and the electrical wiring of a group of inverters, in the example the inverters $I_{25}$ to $I_{31}$, wherein the inverter $I_{13}$ in the lower inner corner, explained with reference to the previous two figures, is illustrated representatively. The inverters are wired to the transformer station W, which, via the transformer located therein, outputs a high voltage HS, above 110 kV, which is fed into the synchronous grid (not illustrated).
Figure 4G:
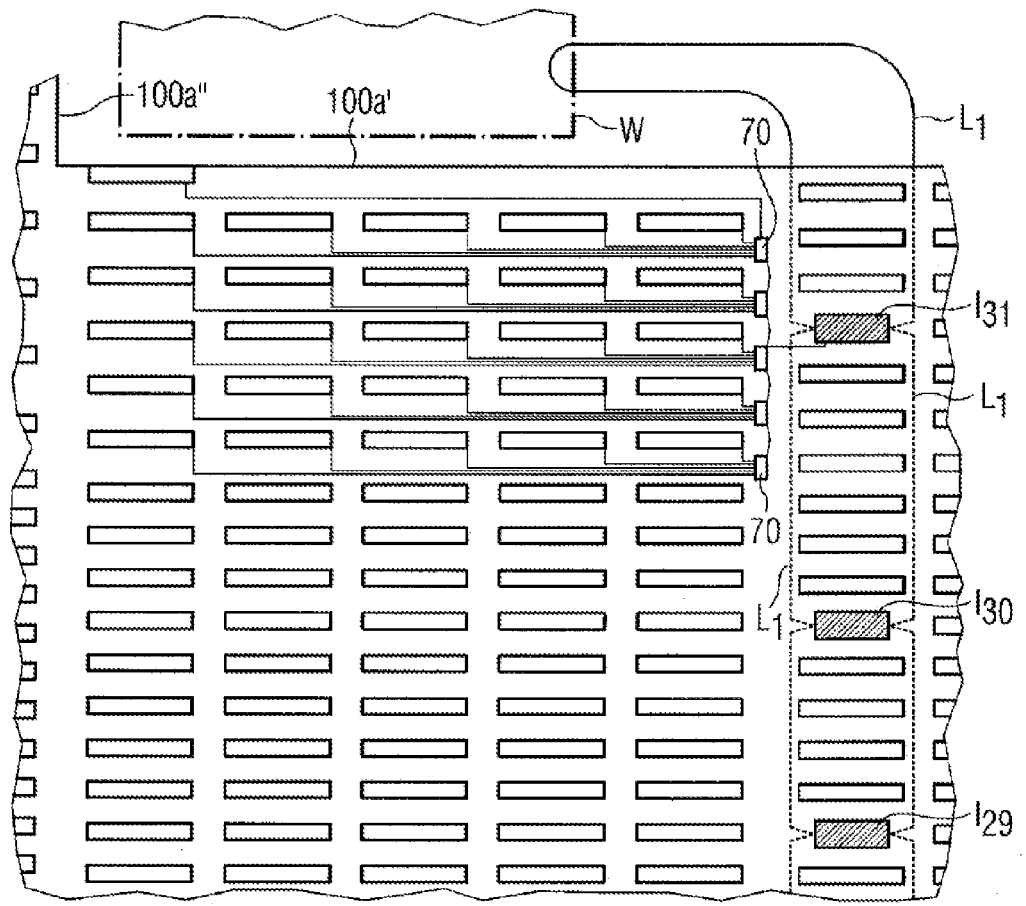
FIG. 4G illustrates an enlarged detail, which more specifically illustrates the region beneath the transformer station W and shows the connection in greater detail of the individual solar panels in this area, wherein the electrical wiring of the right column group of inverters $I_{31}$, $I_{30}$, $I_{29}$ (and further) via the electrical ring main L1 is also illustrated.

The inverters of a first group of inverters are preferably connected to the transformer station via a ring main, and another group of inverters is preferably connected via a further ring main to the same transformer station, see FIGS. 4F and 4G with the ring mains $L_1$ and $L_2$.

The pre-calculation of the layouts of the PV systems by the first computer 31 occurs as follows in the paragraphs outlined above in one exemplary embodiment.

The analysis of the plot of land according to FIG. 3 leads to a first definition of a preferred direction of the panels. A number of preferred directions in a specific area 100a may also be selected. In the illustrated example, the preferred direction is from north to south. This determines the direction of the columns of the solar panels. The row of the plurality of panels arranged side by side within a column runs from east to west, wherein "a" is merely symbolical and the physical spacing between the solar panels in the east-west direction is practically zero.

The preferred direction in the shown example is to be selected relatively easily from north to south because the limits of the plot of land also run substantially from north to south, although they are not arranged at right angles to one another. If these limits of the "specified area" extend with a greater incline, a parallelogram is thus provided rather than a rectangle, and the preferred direction of the panels is thus also oriented in accordance with the limits of the specified area, that is to say at an incline with respect to the north-south direction.

If, in an example that is not illustrated, it is assumed that the first rectangle arranged to the left 100a" remains and the right-hand smaller rectangle 100a' is formed as a parallelogram, with an inclined right-hand edge, the smaller parallelogram will have a different preferred direction compared with that for the large rectangle 100a".

Further considerations should be acknowledged when the area limits do not run in parallel. Then, the preferred direction to be selected is a question of estimation. It can be provided on the basis of engineering concepts, can support engineering know-how, or an optimization can be implemented in the sense of a model calculation, which tests one or more preferred directions. These preferred directions, in different form, may also be the cause and starting point for different layouts of different power stations then created, which fall within the pre-calculated quantity of stored "solutions" of power stations stored in the database 30.

The preferred direction is therefore also a criterion or a property of a layout of power stations that can be used for the subsequent selection and navigation on the display screen 34.

Another possibility for defining the preferred direction is not the use of limits of the plot of land (outer edges), but topological conditions within the plot of land, for example the visible vertical tube 100b" in FIG. 3, that is to say the assumed measurements could also run at an incline by 30°, and can therefore predefine a preferred direction that runs at an incline by 30°, irrespective of the area limits running relatively vertically (north-south). Here too, an inherent layout design of a power station can be provided, which is part of the pre-calculated completed layouts stored in the database.

The placement of the solar panels is a further step associated with a pre-calculated completed layout solution of the photovoltaic system. The column groups are defined first. A column group comprises a number of panel columns, and between two and six (in each case inclusively) panel columns may be assigned to a column group. A single-panel column is also possible, but usually at the edge of the specified areas, see FIG. 4B on the right-hand side.

A column spacing "b", as explained in examples 101, 102, 100, is provided between each two column groups.

In addition, the first column group can start at a distance from or immediately at the left-hand edge, and/or the last column group can be arranged at the end of the area or at a distance from the end of the right-hand edge of the area.

The column group, which preferably includes two to six columns of panels, may also be limited in the edge region to just one panel column, as in FIG. 4B. This is due to the geometry and extension of the specified area, but should not be used as a configuration or design in the interior of the specified area, only in the edge region if need be.

A topology-adaptive column configuration may also be provided, which for example is oriented on the basis of the topology of FIG. 3, that is to say the selection of three wide column groups, second group to fourth group (in the power station layout of FIG. 4A), which are oriented toward the wide strip 100b" in FIG. 3. The specified area may rise and fall in the longitudinal direction of the solar panels (east-west direction) without changing the spacings between the solar panels.

The filling of the column groups is the next step, wherein the solar panels are in each case placed together in a row, that is to say the panels $T_1$, $T_{60}$ and the two adjacently aligned panels arranged next to the aforementioned panels form a row (in the first column group of FIG. 4A).

Then, the second panel row comprising four panels arranged over an equal line in the transverse direction (east-west direction) is then defined (left-hand panel $T_2$). The panel spacing "d" in a north-south direction is given here from the topology of the lower left-hand region in FIG. 3, which is of approximately identical topological height. Here, the panels, starting from the bottom left-hand corner in FIG. 4A, can be placed very closely to each other (d is small), since there is no need to compensate for a topological slope, or there is no gradient favoring a closeness of the panel rows.

Here, it can be said generally that a northward gradient with panel rows oriented southward enables a closer placement or denser placement of the individual panel rows in a respective column group, and a slope means that the panels rows have to be provided with a greater spacing d' (here north-south) in order to prevent the shadowing of the panel arranged further back from becoming excessive as the sun becomes lower. The second (rear) panel row then receives only limited light radiation if it is arranged too closely to the first (front) panel row and a slope is provided along the column group (considered upwardly in FIG. 4A).

A further influence is provided by different topological height positions in the transverse direction of a column group. If the specified area descends more steeply along one half of the width of the column group than the adjacent area portion in the remaining column group, the panel distance in the longitudinal direction of the column group is measured in accordance with the necessary greater panel distance in the descending area portion, although in the left area portion, which does not descend, a closer/denser arrangement of the individual panel rows would be possible.

FIG. 2B shows the shadow angle $\sigma_1$ (sigma) and the angle of inclination $\theta$ (theta) of the surface of the solar panel $T_1$ carrying the solar cells. Both angles are measured with respect to the horizontal H. the second panel $T_2$ is placed at a spacing d from the first panel $T_1$. This spacing d is given in consideration of the shadow angle, of which the extension is shown at $\sigma_1$. It starts at the upper edge of the first panel $T_1$ and runs as far as the lower edge of the panel $T_2$. If there is no gradient and the ground is flat along the topology $B_1$, the panel $T_2$ of the second row is to be placed in the column group as shown in FIG. 2B with the panel $T_2$. If there is a slope, which is shown schematically by $B_2$, the panel $T_2$ is to be arranged lower, that is to say, with the definition of the incidence of the extension of the shadow angle at the lower edge of said panel, must be arranged at a greater spacing d' from the first panel so that the lower edge of the panel $T_2$ is reached by the shadow angle.

The panels are placed in this way in succession (one transverse row of panels in a column group in each case) so as to fill the column group. The placement of the panels with the next-adjacent column group, in FIG. 4A the second column group, still without the inverters I shown there, is then started with solar panel $T_{250}$.

The entire specified area is filled in this way along the previously defined preferred direction and the predefined column groups, in each case between the actual spacer strips b.

"Inverter areas" are defined in a third step. Here, a fully occupied specified area that is occupied by panels as shown in the three examples of FIGS. 4A, 4B and 4C constitutes the starting point, wherein different panel placements and different column group definitions and also different placements of the spacings b of the column groups are provided in each case.

The starting point of the placement of a first inverter is a first group of solar panels and a cabling effort, which is to be kept low, on the direct current side.

The inverter $I_m$ is supplied with current from all solar panels belonging to its group $G_m$. This is referred to as an "inverter area" or also the sub-group. In FIG. 4A, the group $G_1$ is assigned to the inverter $I_1$, and all panels are connected via their DC voltage cables to this inverter. The group $G_2$ is assigned to the second inverter $I_2$, which is arranged further above along the first spacing width $b_1$ between the two first column groups of panels. The twelfth group $G_{12}$ is assigned to the twelfth inverter $I_{12}$ at the upper edge.

A group can be assigned in the shown example such that all inverters are to be arranged along the first spacing width $b_1$, formed for example as a cable path. The next spacing width $b_2$ parallel thereto between the second and the third column group of solar panels is to be formed in the example as a road (for servicing), and no inverters are to be arranged thereon. The next spacing width $b_3$ is formed as a cable path and comprises inverters spaced in the longitudinal direction (north-south).

The assignment to an inverter can be performed successively, starting with the first two column groups together, from right to left and in lines (in rows). When the nominal power of the inverter $I_1$ is reached by the assignment of a quantity of solar panels $T_1, T_2 \ldots$, the first group $G_1$ is complete. An approximately centrally arranged panel is then removed and the inverter $I_1$ is placed at its location (as centrally as possible in the first group).

Here, an overdimensioning or overgrouping may be implemented, wherein more solar panels than corresponds to the nominal power of the first inverter $I_1$ are electrically assigned thereto, that is to say the nominal power of a panel multiplied by the number of solar panels is the inverter power (nominal power), or is overcharged by 30% to 50% or more than 100% as considered on the basis of the nominal power of the panels. Conversely, an underdimensioning up to 30% can be provided. It is favorable if the inverter power is selected in practice in accordance with the sum of the panel capacities of the first group $G_1$. This is also true for the other panel groups (inverter areas) of the entire specified area.

To this end, the inverters are placed as specified further above for a group, or, on the other hand, the next group of solar panels is assigned to the next inverter. If, right at the upper end, the inverter $I_{12}$ is not supplied with enough nominal power from solar panels to reach its nominal power, panels can be added from the next column group(s). in the example, this is also implemented by assigning all remaining panels of the left-hand column group, that is to say of the group $G_{12}$ and also the upper solar panels of the other three column groups, to the upper inverter $I_{12}$ until its nominal power is reached. All solar panels at the north edge of the area $100a''$ are electrically conductively routed to the inverter $I_{12}$.

The inverter areas can also be constructed conversely, that is to say from top to bottom (north to south). In a further possibility of placing the inverters, inverters can be placed from both directions, that is to say from top and bottom, and can be assigned groups of solar panels, and, with a residual panel quantity in the central region of the two left-hand column groups, solar panels can also be added from the further third right-hand column group.

It should be noted that a panel row that comprises the first group of four solar panels and the second group of five solar panels does not have to be assigned as a whole to an inverter, but, as the third panel column group shows (above panel $T_{550}$), individual panels (here three panels denoted by $T_{580}$) within a panel row can also be assigned to another inverter (other gray value of the panel group).

The assignment is performed over the entire specified area $100a$. The number of sub-groups of solar panels is given, as is also the number of inverters. Different gray values of panels indicate different inverter areas.

All inverters are then electrically connected and assigned by AC voltage lines to the transformer station W. This is preferably implemented via ring mains $L_1$, $L_2$ illustrated in FIG. 4F, in which case a group of inverters is arranged in an electrical ring main and the transformer W is arranged in the same ring main. If the ring is interrupted, a safeguard is provided because the current from the inverters can flow via the other portion of the ring. Greater reliability is thus achieved. There is also no reason why a star-shaped connection form cannot be used from each inverter $I_m$ to the transformer station W.

The inverters deliver a greater AC voltage in the region of 15 kV. The transformer station W converts this voltage into the frequency of the country in which the area 100a is located, at a higher voltage level, preferably 110 kV to 330 kV.

The cabling effort can be provided with a criterion in accordance with which its aluminum or copper weight is fixed and defined as a configuration parameter (a criterion) of the PV system thus formed and defined as a layout. Here, the line length is not of primary relevance. The total quantity of used copper or aluminum for the lines and cables is of interest in terms of the weight thereof. Contrary to this is the minimization of losses over the lines, which rises if the cross section is too small, such that various configurations of electrical cabling may belong to various PV systems, which are based on the same panel distribution. A number of variants can thus be produced, which are also available as part of the database 30 and as pre-calculated solutions (layouts) for possible (constructible) photovoltaic systems 100, 101, . . . .

The cabling of alternating current and direct current cables is oriented primarily to the arrangement of the panel rows and of the column spacings, which run at right angles to one another. The cables are preferably laid along this right-angled grid and not transversely or diagonally beneath the panels. The same is true for the preferred direction of the area geometry of FIG. 4A running substantially from north to south. If the embodiment were parallelogram-like and if the preferred direction were oriented at an incline, the cable paths would run accordingly in an inclined manner. Generally, it can be said in this regard that the preferred direction determines a direction of the cable guidance, and the direction of the panel rows defines a second direction of the cable guidance and line guidance.

FIG. 4F illustrates a possible laying of the electrical cables/lines.

An embodiment of part of the direct current cabling and part of the alternating current line guidance for the example of FIG. 4A is shown by way of example in FIGS. 4F and 4G. There, the right-hand portion (the three right-hand column groups) are highlighted and illustrated in an enlarged manner. The inverters have names: the upper inverter is $I_{24}$, the left-hand lower inverter is $I_{13}$. The right-hand upper inverter is $I_{31}$ and the right-hand lower inverter is $I_{25}$. All of these inverters are coupled to the transformer station W by lines. The upper group of inverters is illustrated and is connected via a ring main $L_2$ to the transformer station W. If there is a cable break at any point, all inverters can still deliver their AC voltage and their AC current to the transformer station W via the other arm or branch of the ring main. In the right-hand part, the inverters $I_{31}$ to $I_{25}$ are connected to the transformer station W via the same ring $L_1$. Here, the line is guided vertically.

The individual panels are electrically connected by cables, of which some are shown in an exemplary manner as $K_1$, $K_2$, $K_3$ and $K_4$. Each panel itself is connected via dedicated cables to an AJB (array junction box), and a plurality of these array junction boxes are electrically interconnected at a GJB 70 and then connected to the inverter $I_{31}$, to which the group of panels is assigned. Here, the inerter $I_{31}$ is illustrated, to which the current from five GJBs 70 (generator junction boxes) is fed from the second column group from the right. The panels arranged in the right-hand column group, which are also assigned to this inverter I31, are not shown electrically connected via lines, but, in accordance with the example of the second column group from the right, are also electrically connected.

Accordingly, all further inverters $I_{13}$ to $I_{24}$ of the portion illustrated in FIG. 4F are also connected to the transformer station W. Of course, the remaining inverter column from $I_1$ to $I_{12}$ from FIG. 4A is also connected to the transformer station W (not illustrated) and the associated panels or panel groups per inverter are also connected via direct current lines. There is no panel that supplies current that is not connected.

If a multiplicity of more than at least 20, preferably also more than 100, PV systems are stored in the database, these stored, pre-calculated power station layouts (PV systems) can be utilized. Each of these systems can be immediately used, constructed and implemented in reality. The specified area used for this purpose is the space where the system is placed. Each panel $T_n$ is defined in terms of its geometry and its arrangement, each inverter is defined, the spacings between the column groups are defined, the position of the transformer station W, and also other technical parameters of the panels, for example the angle of inclination of the solar cell surfaces, are also defined and determined. All track guides for the cables (DC) and all track guides for the lines (AC), which lead from the panels $T_n$ to the inverters and from the inverters $I_m$ to the transformer station W respectively are also defied and determined. Each system is thus immediately constructible, however is initially provided for selection, optimization and a possible scenario comparison, with technical specifications of the (one) photovoltaic system then actually constructed, selected from a large number of layouts, which are already complete, of (many) photovoltaic systems stored in a retrievable manner in the database 30 for a display presentation 34, 34a.

FIGS. 5A to 5D show the graphical presentation of the multiplicity of completed (constructed) and pre-calculated layouts of power stations.

Figure 5A:
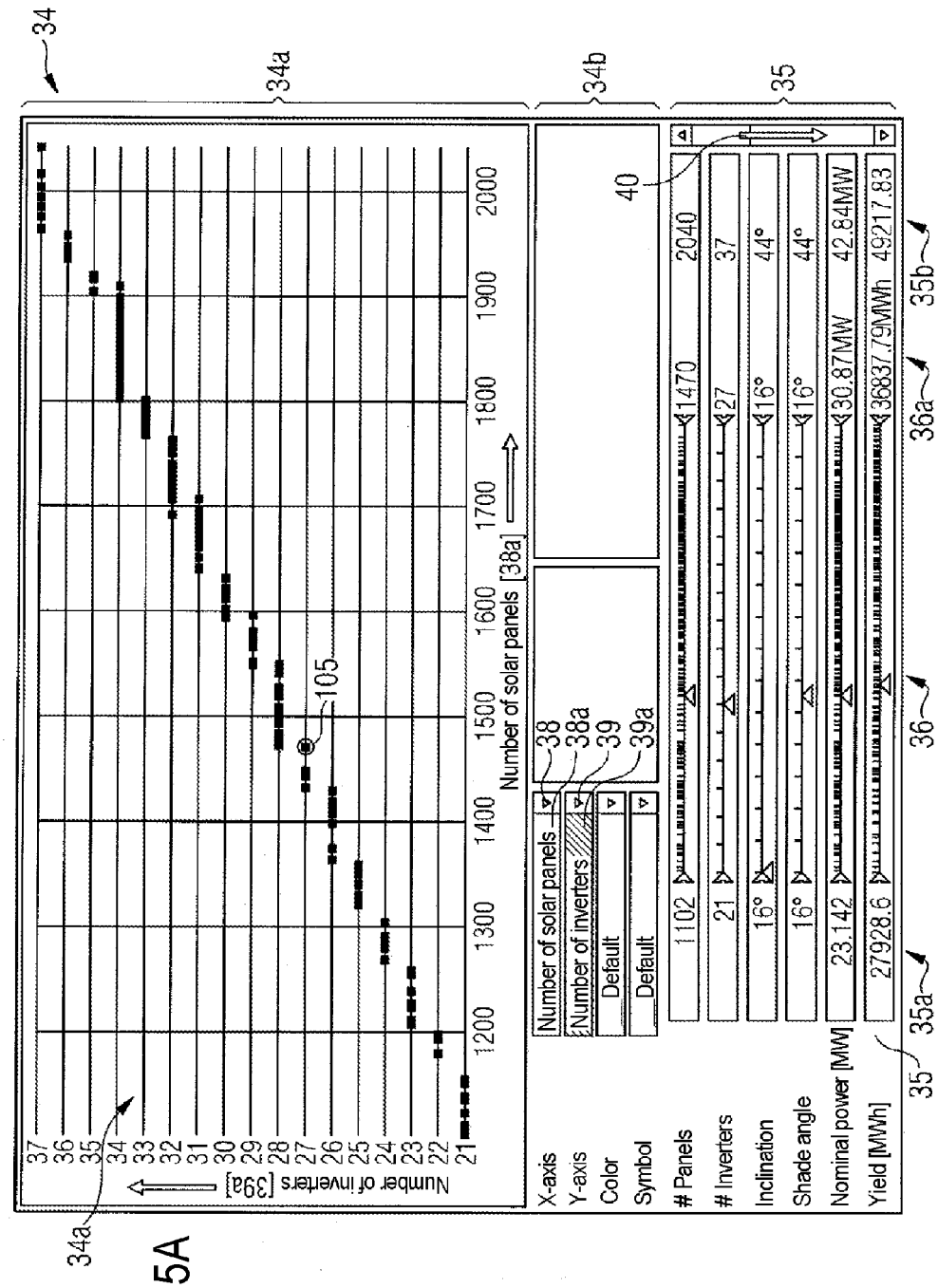
FIG. 5A shows an illustration of the display screen 34 from FIG. 1, wherein the coordinate region 34a and a scale region 35 (with graphically presented axes) can be seen.

FIG. 5A is an enlarged illustration of the display screen 34 and shows three portions arranged vertically one above the other. The upper portion 34a is a two-dimensional presentation of an any-dimensional space. The X-axis (number of panels) and the V-axis (number of inverters) are illustrated for a multiplicity of power stations (PV systems), each represented by a point. The PV system 105, which is shown with characteristic variables (its property values) in the third region 35 (from above) of the on-screen presentation 34, or is represented abstractly, is circled.

A multiplicity of graphically presented sliders, which represent the property values of the PV system 105 by a wedge 36 on each of the scales, are in the region 35. In the region 36a, the specifically selected PV system is presented with values, for example with the following property values: a number of 1470 solar panels, 27 inverters, an angular inclination of each solar panel of 16° (with respect to the horizontal), a shadow angle of 16°, for determining the spacing between the panels, wherein the spacing between the panels varies in accordance with the illustration of FIG. 4A in a manner dependent on the topology, but with uniform shadow angle. The nominal power (peak power), is also specified at 30.87 MW. The "yield post inverter" (annual yield) is illustrated as 36,837.79 MWh. These characteristic variables describe the PV system 105, circled in the X-V presentation 34a, wherein 27 inverters and 1470 panels are singled out from the coordinates over the axes.

In the central portion 34b, the X-axis and the V-axis in the region 34a can be selected and adjusted via combo boxes or switch fields 38, 39, wherein the values in the upper portion 34a of the screen presentation 34, which are indicated on the scales in the region 35, are then presented. In the example, six technical property values are provided, of which two property values have been selected in the intermediate region 34b and are conveyed visually to the observer in the presenting portion 34a as a coordinate presentation. This visual mediation occurs abstractly in the manner of "one point one power station", wherein the power station 105 is represented with the technical properties 36 and the panel number and the inverter number of this PV station 105 is singled out herefrom for the purposes of explanation. The other point presentations in the region 34a correspond to the small lines on the six scales in the working region 35.

The two end values of these scales are shown to the left at 35a and to the right at 35b. The pre-calculated power station layouts available in the memory 30 have a panel number between 1102 and 2040. Accordingly, they have a nominal load between 23.142 MW and 42.84 MW.

These limit values can be seen from the end portions 35a, 35b. The other values can be explained in accordance with the embodiments concerning the two singled-out scales "panel number" and "nominal power".

It should be mentioned that the property "yield post inverter" (bottom scale in FIG. 5A) is meaningful for power stations. It is calculated via the annual yield and is specified in a performance variable, power times time. A "yield post inverter" of 36.838 (rounded up) MWh is calculated for the presented power station 105 with the 1470 panels and 27 inverters. This does not take into consideration directly the nominal power of the power station times the number of days (accordingly hours) of the year, but specifies the yield per year under consideration of weather data of the geographical location at which the area is located, in which the PV system 105 has been constructed (hypothetically). It also takes into account all property values that are additionally evident for the system 105 in FIG. 5A.

From the yield (per year), the user or operator of the system can calculate the yield that he can expect to sell per year to his customers. He can then calculate from this his prices for the sold electricity, he can calculate depreciations, and he can estimate the profitability of the system.

For the technical consideration relevant here, the actual technical value is of primary relevance. Other economic factors may be of additional relevance for the user. The "yield post inverter" (yield per year) contains a technical component and for the operator an economical aspect of the "calculability".

In so far as the nominal power can be determined more easily, it may be proportionally dependent on the number of panels when each panel is constructed identically and provides an identical discrete initial power. It can be seen at the scroll bar 40 in FIG. 5A that a number of further technical property values of the presented PV systems in field 34a can be scrolled through in the viewing field.

These also include, for example, the following variables explained here, however these are not presented separately.

One technical measure is the sensitivity to construction errors. Each system, which has been planned individually, has a high measure of individual construction work. A system that is planned more uniformly can be implemented more easily for the step of carrying out the construction. It is less susceptible to construction faults. A system that has been planned individually such that each panel spacing may be different from that shown in FIG. 4A is more susceptible to construction faults and is more complex in the construction phase. This value "robust system" is intended to indicate that a system changes its power in a manner dependent to a greater or lesser extent on construction faults. Robust systems and sensitive systems can then be distinguished on the scale, see FIG. 6A in this regard.

A further value, which often plays a key role for the operator, is the LCOE (levelized cost of electricity), which combines a large number of variables and clearly describes the average costs per produced kilowatt hour (KWh) over the service life of the system. For example, the service life of the system may be 20 years, and an exemplary value for a LCOE is 17 cents per kilowatt hour (KWh). The change to the system over time, that is to say the reduction of the actual output power of the solar cells, of which the surface degrades over time and which therefore may not deliver their assumed power over the entire service life, is also taken into account in this property value, which represents technical variables. Assumed degradation values are between 1% to 1.5% at the start, and additionally a reduction of 0.5% per year over the course of the years up to the service life of 20 years. With a service life assumed to be 20 years for a PV system, values from 10% to 15% of a reduction of the output power are estimated compared with the installed power at the start of the service life of the PV system.

The LCOE can also take into account the fact that the nominal power actually specified for solar cells is not their actual nominal power. The nominal power is a power per cell measured in the laboratory (times number of cells in a panel gives the panel power), with a light radiation of 1,000 W/m$^2$, irradiated perpendicularly onto the surface of the solar cells. When multiplied by the number of the panels, this gives a nominal power of the system, however this is not actually achieved, because, in the actual model, the cells are not always exposed perpendicularly to the light irradiation, the light power is not always 1,000 W/m$^2$, and the temperature has a further influence. The installed nominal power is therefore already different from the specified (laboratory) nominal power and can be and is even considered in the LCOE. The LCOE is therefore a realistic property of the power station in its layout configuration.

Figure 5B:
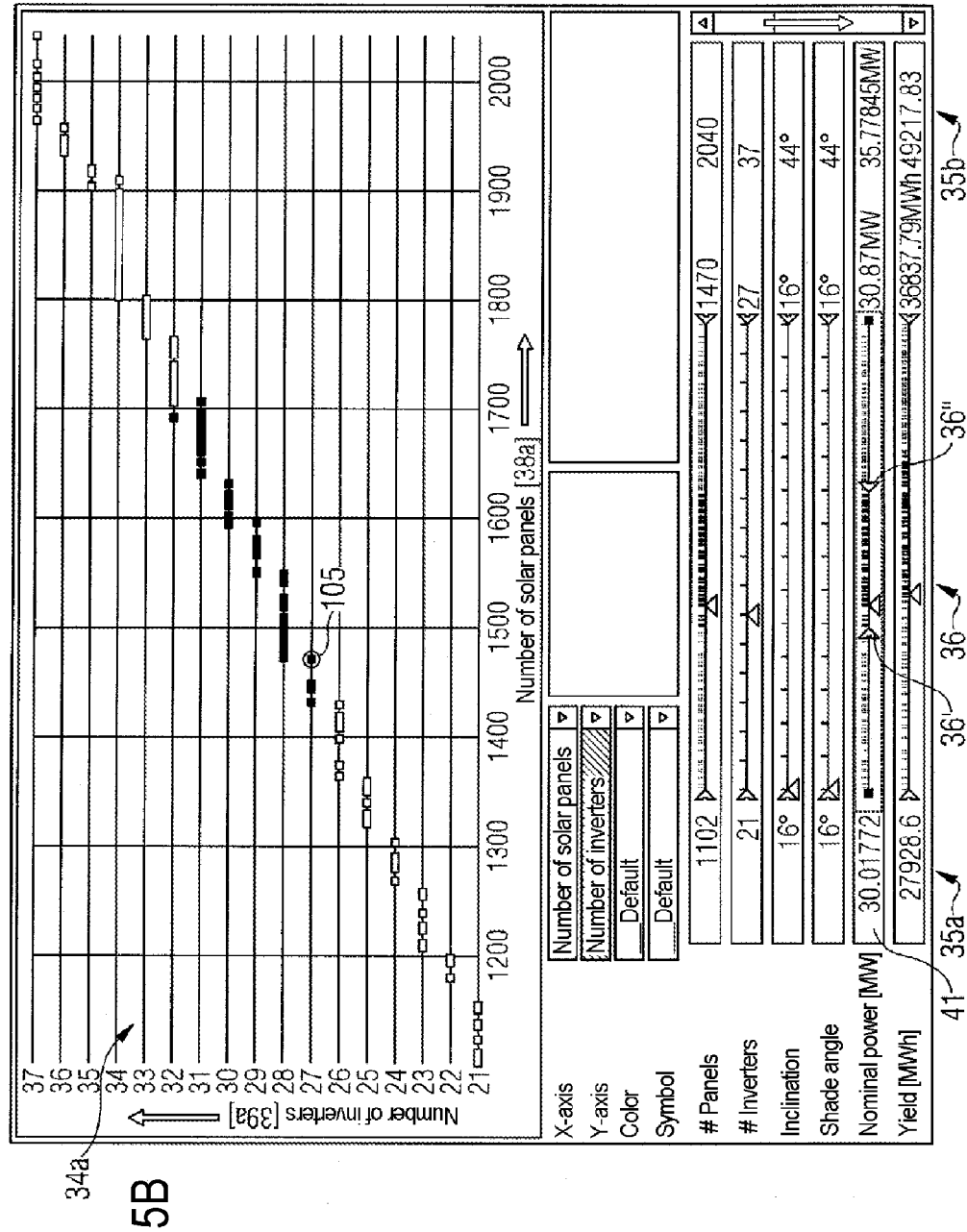
FIG. 5B shows the illustration of FIG. 5A with a restriction to the scale 41.

FIG. 5B shows a restriction, that is to say a limitation of a property range, which is explained here in the example with reference to the scale 41. All other scales can be limited similarly.

The limitation can be seen by two limits, which, by 36' and 36" on the scale 41, limit the power range. The two limit values to the left and right on this scale are limited by the wedge-shaped sliders 36' and 36" to a range that is illustrated to the left and right in the region 35a and 35b, that is to say approximately 30 MW and 35.8 MW. Selected from this is the same system 105 with the nominal power 30.87 MW, which is also singled out by being circled in the coordinate presentation portion 34a. The PV systems now remaining there are much fewer than in FIG. 5A, and are only those that correspond to the criteria of the axis 41, that is to say have a nominal power (peak power) within the range between 36' and 36". The other power stations are either faded out or "grayed out" (illustrated in gray compared with a darker or stronger contrast of the selected power stations) in the region 34a.

Figure 5C:
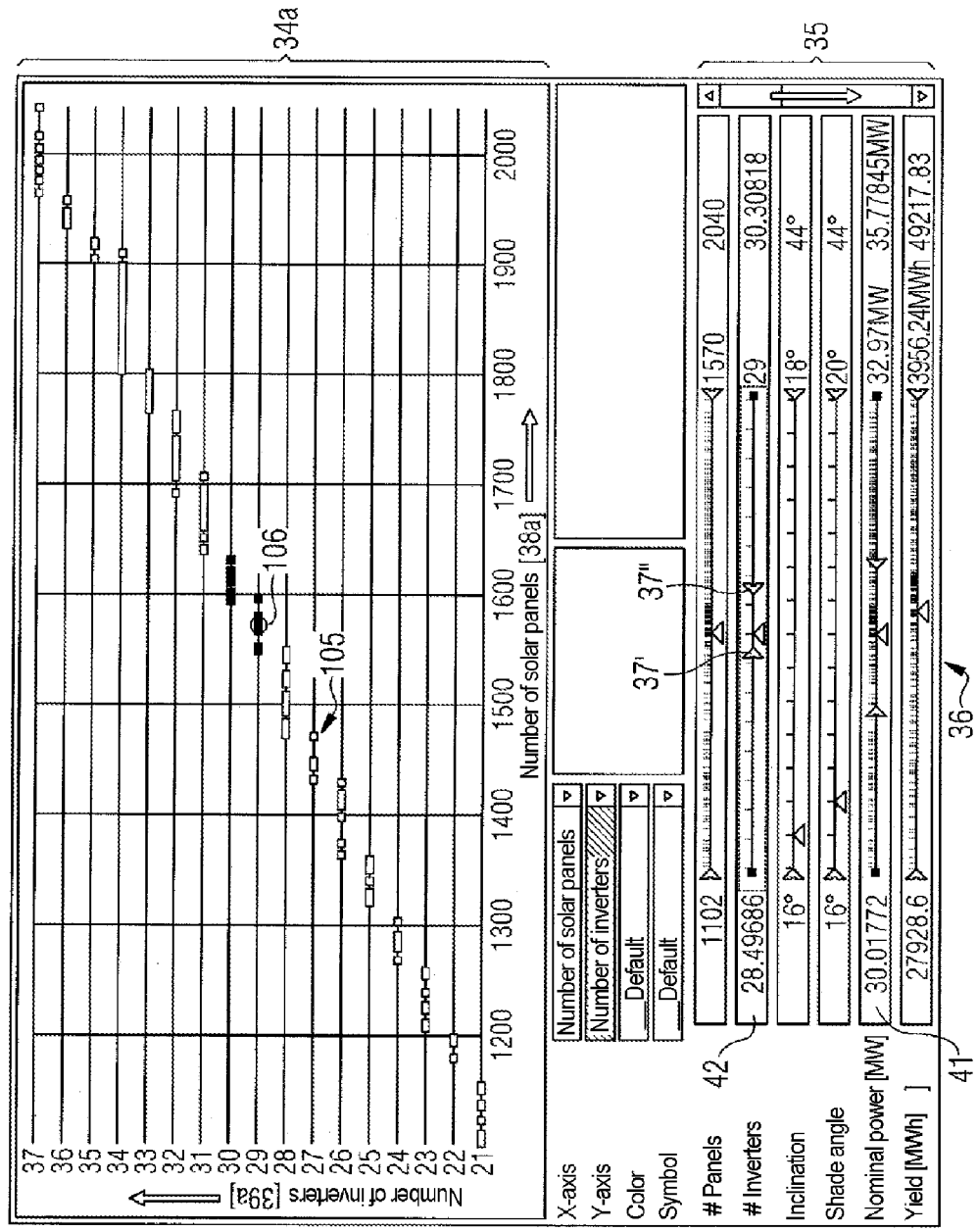
FIG. 5C shows the illustration of FIG. 5B with a second, additional restriction to the scale 42.

A further limitation of an additional scale 42 is shown in FIG. 5C. The number of inverters of the scale 42 is limited between 29 and 30 (the presented fraction is not to be considered here, there are only whole numbers of inverters). These two limits 37' and 37" are actually two numbers of inverters 29 and 30, as can be seen at the two short scale lines. The number 29, of which the associated system 106 is illustrated in the coordinate region 34a, is selected between these two values.

All other systems are "grayed out", that is to say illustrated with a lower contrast. Only a few systems remain from the multiplicity of systems of FIG. 5A and are still highlighted as a result of the two restrictions (limitations) of the two scales 41 and 42. The system 105 illustrated previously in FIG. 5B no longer meets the conditions of these restrictions and therefore no longer satisfies the predefined profile from the working region 35, and is therefore grayed out in the portion 34a. Instead, another system 106 is highlighted (represented by a circle) and corresponds to the values delimited in a predefined manner in the working region 35.

The user can of course change a selected system at any time by changing the sliders 36 with upwardly presented wedge. Here, it is sufficient to change one of the six illustrated sliders 36, since a group of property values of course always also belongs to a system. However, since a number of systems may be associated with a property value, the selection via the sliders 36 is not always clear. It would then be clearer to select one of the systems illustrated in the coordinate region 34a, that is to say for example the system 106 (symbolized by a circle), which is highlighted in FIG. 5C. This then adjusts the sliders in the working region 35, such that the property values associated therewith are characterized, more specifically in a manner visible to the user.

The set restrictions can also be canceled by shifting the left and right wedges outwardly again. Rather narrow ranges can also be isolated, and systems can be compared if different systems are "clicked on" via the region 34a.

Figure 5D:
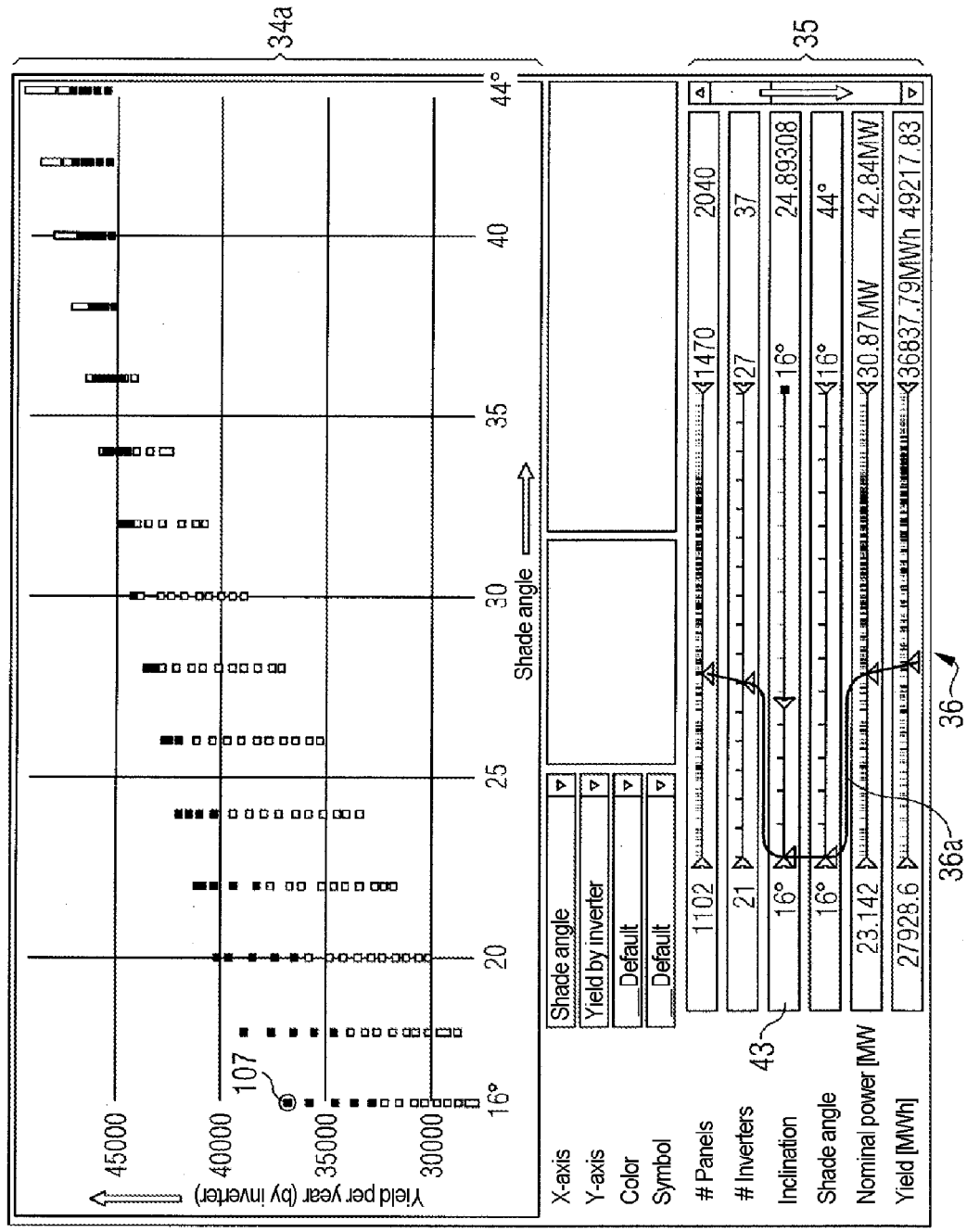

A very complex relationship, which is not evident, although a system configuration and a layout are known, is illustrated in FIG. 5D. This shows, plotted in the region 34a, the yield per year (vertically) and on the horizontal axis the shadow angle, which is a construction angle, with which the panel spacings of the system in the area according to FIG. 3 for example are configured in the layout. If the angle of inclination of the axis 43 is changed in the sense of a limitation between the values 16° and 24.89° (angle of inclination of the solar surface 20 with respect to the horizontal), the highlighted group of power stations thus selected is given.

It can be seen from this illustration in the region 34a that for high shadow angles systems with high yield are grayed out or faded out (above 35° shadow angle). For systems with a lower shadow angle (below the specified limit value), systems with lower yield are grayed out. This is a limitation caused by the delimitation of the permitted range of the angle of inclination. The connection line 36a shown connects the selected properties of the system 107, which, with a shadow angle of 16° and an angle of inclination likewise of 16°, is highlighted by a circle in the portion 34a.

This system belongs to the systems also selected within the right and left limits in the working region 35 on the six property scales.

Figure 6A:
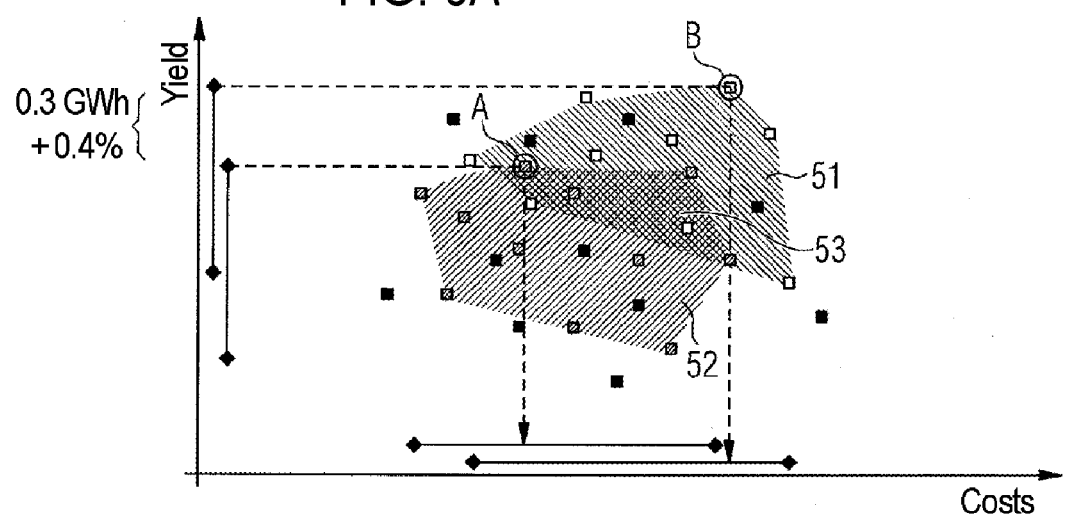
FIG. 6A shows a scenario comparison with two basic types of layouts of PV systems in the two regions 51, 52 hatched in different directions, these regions overlapping in the area 53.

FIG. 6A shows a scenario comparison. This is a comparison of at least two (basic) types of layouts.

Figure 6B:
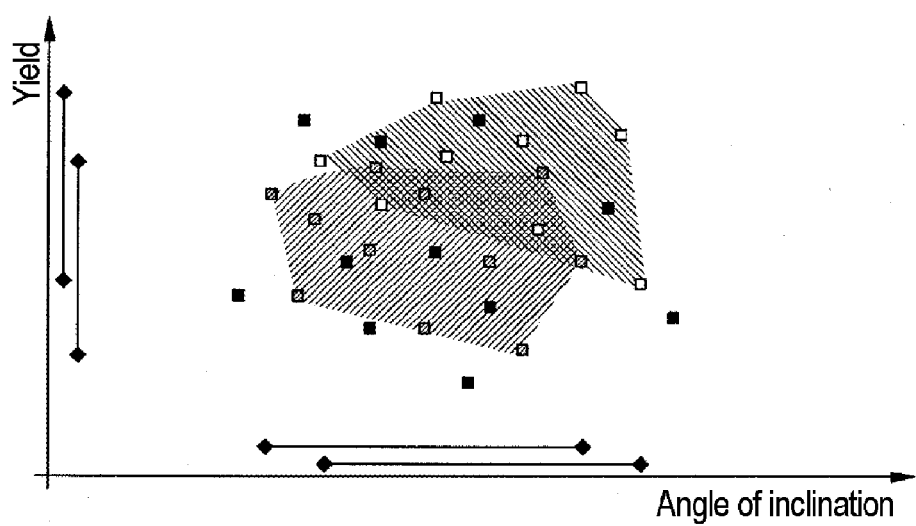
FIG. 6B shows the illustration the presentation of "yield" over "angle of inclination" (of the solar surfaces 20).

So as to supply the user with further-reaching information concerning such "scenarios", further details can be displayed in the graphical surface GUI 34. In the images of technical properties, which are shown hereinafter by FIG. 6A, the axis labelings "costs" and "yield" are to be understood only representatively for characteristic figures of interest and can be changed as required by switch fields 37, 38; see FIG. 6B with the presentation of "yield" over "angle of inclination" (of the solar surfaces 20).

By way of example, information concerning characteristic figure ranges that cover individual scenarios can additionally be inserted in the coordinate region 34a.

For the sake of improved clarity, the ranges of a scenario covered in the characteristic figures are initially displayed as colored or other contrasting stretches beside the axes. In FIG. 6A, a horizontal and a vertical darker (inner) section can be seen corresponding to the parameter "costs" or "yield". This is a first scenario. It belongs to the first type of layouts, which are combined in the area further to the left/below (hatching to the right).

If a further scenario has been defined, this is marked by a different color or another contrast, as can be seen in FIG. 6A. In FIG. 6A, a second horizontal and a second vertical lighter (outer) section, also corresponding to the parameter "costs" or "yield", but for the second scenario, can be seen. It belongs to the second (basic) type of layouts combined in the second area further to the right/above (hatching to the left).

Layouts of PV systems not selected can also be illustrated outside the two hatched areas.

By way of example, the scenarios could denote a simple, robust (arrangement of the panels less susceptible to construction faults) and favorable layout (dark hatching to the right) and an individual layout (arrangement of the panels more sensitive to construction faults), which is more costly (light outer sections, area to the right at the top of the hatching to the left). Here, the user sees that a yield difference of 0.3 GWh prevails between the PV system layouts having the highest yield in both scenarios, which corresponds to an extension of the optimization scope by 0.4% as a result of the use of individual layout compared with a robust layout.

In other words, a higher yield can be attained with individual layout than with robust layout. The user now has to decide, however, whether the yield gain by individual layout is large enough for example to justify the increased costs (and other altered technical properties).

A further example for sensible functionality with the visualization is as follows.

The user can compare two arbitrary PV systems (that he has identified for example as being the most interesting from each of two "scenarios" or as two of the most interesting systems from an individual scenario) by clicking on the two PV systems in the coordinate region 34a. In the image, a section is inserted. The differences between the two systems in terms of the current characteristic figures are displayed in absolute terms and in the form of percentages. The user can thus analyze the significance of the differences between the two alternative layouts in terms of the characteristic figures.

A first approach enabling use of discrete parameters from the design space in the visualization would be a presentation as a "pseudo number", that is to say for example a yes-no decision such as "block design or not?" is assigned two values such as "0" and "1", which correspond to the answers "no" and "yes". An instant integration of these discrete parameters into the existing graphical concepts is achieved in this way.

In the characteristic figure view, the systems belonging to "block design" and "no black design" would appear for example to the left and right in the view when the x-axis corresponds to this parameter. A visualization is thus achieved and the user can identify the different systems in the surface. This concept could also be generalized to decisions that require a selection from possibilities that are not too great in number (just a few possibilities). By way of example, five different module technologies used for planning can be assigned to the number values 1 to 5.

A scenario can be divided into sub-scenarios ("sub-cases").

A starting scenario is given (in a color or a contrast). The user takes this scenario and allows the software to divide the scenario into the groups "PV system has at most five spacer columns" and "PV system has at least six spacer columns".

This could be achieved for example if, in a function "divide scenario", there is the possibility to adjust a threshold value for a characteristic figure (number of spacer columns) by one of the sliders from the graphical surface in the region 35, such that a selected scenario is divided into the cases "characteristic figure at most equal to the threshold value" and "characteristic figure greater than the threshold value". In the case in question, the threshold value for the number of spacer columns would be set to the value 5.

FIG. 8 shows a schematic flow diagram of an exemplary embodiment of a method for creating a physical layout of a photovoltaic system in a specified area.

In a step 1101, more than 20 pre-calculated completed layouts for the photovoltaic system are read from a memory 30.

In a step 1102, the completed layouts are presented in a graphical presentation in such a way that each of the completed layouts is represented with at least some of the multiplicity of technical properties.

In step 1103, value ranges of the presented technical properties are changed so as to present an altered number of completed layouts comparatively.

In step 1104, a layout optimized in terms of the presented properties is selected from the altered number of completed layouts.

The invention claimed is:

1. A method for creating a physical layout of a photovoltaic system in a specified area, wherein the photovoltaic system is specified by a multiplicity of technical properties, the method comprising:
reading out a plurality of pre-calculated completed layouts for the photovoltaic system from a memory;
presenting the completed layouts in a graphical presentation in such a way that each of the completed layouts is represented by at least a partial number of the multiplicity of technical properties, the multiplicity of technical properties includes an angle of inclination supplemented with a shade angle;
modifying value ranges of the presented technical properties in order to present a modified number of completed layouts comparatively; and
selecting from the modified number of completed layouts a layout optimized with regard to the presented properties
wherein the completed layouts with the partial number of the multiplicity of technical properties are presented such that a number of technical property scales are formed in a scale region of the graphical presentation, wherein the same technical property of the completed layouts is plotted on each technical property scale, and
wherein each presented completed layout is represented in a coordinate region of the graphical presentation by a marking and is localized in the coordinate region of the graphical presentation via at least two of the technical properties.

2. The method as claimed in claim 1, wherein the multiplicity of technical properties comprises at least:
one first multiplicity ($N_{100}$) of solar panels ($T_n$; n=1 . . . N) arranged side by side and/or one behind the other, in each case with a surface carrying solar cells that generate electrical direct current;
one second multiplicity (M) of DC-AC converters ($I_m$; m=1 . . . M), to which the direct current generated by the solar panels ($T_n$) is fed via cable, and
at least one transformer station (W), to which a high-voltage AC voltage is fed from the DC-AC converters ($I_m$) via lines.

3. The method as claimed in claim 2, wherein each DC-AC converter is assigned to just one solar panel (T1).

4. The method as claimed in claim 2, wherein the second multiplicity is less than 50% of the first multiplicity.

5. The method as claimed in claim 2, wherein the second multiplicity is less than 10% of the first multiplicity.

6. The method as claimed in claim 1, wherein the multiplicity of technical properties comprises:
an arrangement of all solar panels ($T_n$) in the specified area;
a placement of the DC-AC converters ($I_m$);
track guides of cables and lines; and
a position of the at least one transformer station (W).

7. The method as claimed in claim 6, wherein the multiplicity of technical properties comprises:
groups of solar panels, wherein each group of solar panels is assigned to a DC-AC converter.

8. The method as claimed in claim 7, wherein no more than one group (G1; G2) of the first multiplicity ($N_{100}$) of solar panels ($T_n$) is assigned to each DC-AC converter.

9. The method as claimed in claim 7, wherein the second multiplicity (M) of DC-AC converters ($I_m$) is smaller than the first multiplicity ($N_{100}$) of solar panels ($T_n$);
each DC-AC converter ($I_m$) is fed, via cable, electrical direct current generated by its assigned group ($G_m$; m=1 . . . M) of solar panels ($T_n$), wherein each group of solar panels ($T_n$) contains no more than half of the first multiplicity of solar panels ($T_n$) and/or a nominal power ($P_m$) of a respective group ($G_m$) of solar panels ($T_n$) corresponds to at least half of a nominal power of the DC-AC converter ($I_m$) assigned to the group ($G_m$); and
the at least one transformer station (W) is fed, via lines, the high-voltage AC voltage of at least one first group of DC-AC converters ($I_m$).

10. The method as claimed in claim 1, wherein the photovoltaic system has a nominal power above 2 MW.

11. The method as claimed in claim 1, wherein a limit can be set at one end or both ends at least on one technical property scale so as to highlight by a marking in the coordinate region only the completed layouts of which the technical property value on the limited property scale lies within the set limits.

12. The method as claimed in claim 11, wherein two technical property scales can be adjusted jointly at one end or both ends by a respective delimitation.

13. The method as claimed in claim 11, wherein the delimitation at one end or both ends is canceled so as to again present uniformly the plurality of completed layouts in the coordinate region.

14. The method as claimed in claim 1, wherein two completed layouts of different types are represented in the coordinate region by a different marking respectively and are localized via at least two of the technical properties, each along a coordinate axis, so as to be able to compare the two types of completed layouts via the two technical properties on the coordinate axes.

15. The method as claimed in claim 14, wherein one fundamental type has a more robust arrangement of the panels ($T_n$), less susceptible to construction faults, and the other type has an irregular arrangement of the panels ($T_n$), more sensitive to construction faults.

* * * * *